US012768884B2

(12) United States Patent
Fayneh et al.

(10) Patent No.: US 12,768,884 B2
(45) Date of Patent: Oct. 20, 2026

(54) INTEGRATED CIRCUIT MARGIN MEASUREMENT FOR THE DETECTION OF RARE EVENTS

(71) Applicant: PROTEANTECS LTD., Haifa (IL)

(72) Inventors: Eyal Fayneh, Givatayim (IL); Edi Shmueli, Nesher (IL); Evelyn Landman, Haifa (IL)

(73) Assignee: PROTEANTECS LTD., Haifa (IL)

( * ) Notice: Subject to any disclaimer, the term of this patent is extended or adjusted under 35 U.S.C. 154(b) by 196 days.

(21) Appl. No.: 18/644,834

(22) Filed: Apr. 24, 2024

(65) Prior Publication Data

US 2025/0334633 A1 Oct. 30, 2025

(51) Int. Cl.
*G01R 31/317* (2006.01)

(52) U.S. Cl.
CPC .................. *G01R 31/31703* (2013.01); *G01R 31/31725* (2013.01)

(58) Field of Classification Search
CPC .................... G01R 31/31703; G01R 31/31725
See application file for complete search history.

(56) References Cited

U.S. PATENT DOCUMENTS 4,555,663 A 11/1985 Shimizu
5,548,539 A 8/1996 Vlach et al.
5,748,509 A 5/1998 Fewster
5,774,403 A 6/1998 Clark, II et al.
5,818,251 A 10/1998 Intrater
5,895,629 A 4/1999 Russell et al.
(Continued)

FOREIGN PATENT DOCUMENTS

CN 1886668 A 12/2006
CN 101014991 A 8/2007
(Continued)

OTHER PUBLICATIONS

M. Cho et al., “Postsilicon Voltage Guard-Band Reduction in a 22 nm Graphics Execution Core Using Adaptive Voltage Scaling and Dynamic Power Gating”; in IEEE Journal of Solid-State Circuits, vol. 52, No. 1, pp. 50-63, Jan. 4, 2017. doi: 10.1109/JSSC.2016.2601319.
(Continued)

*Primary Examiner* — Dominic E Hawkins
(74) *Attorney, Agent, or Firm* — The Roy Gross Law Firm, LLC; Roy D. Gross

(57) ABSTRACT

A specific logic circuitry of a semiconductor Integrated Circuit (IC) is measured by a sensor. The sensor includes: a signal splitter that splits a signal from the specific logic circuitry into two test paths; a delay element that receives and applies a delay to a first test path, the delay based on a predetermined timing margin that is selected from a group of discrete timing margin values comprising a shortest timing margin value and at least one longer timing margin value; a comparison circuit that compares the delayed first test path and a second test path and provides a measurement output according to the comparison for an instance of measuring; and a controller that sets the predetermined timing margin such that, over the instances of measuring, a frequency of selection of the shortest timing margin value is higher than a frequency of selection of each longer timing margin value.

32 Claims, 16 Drawing Sheets

(56) References Cited

U.S. PATENT DOCUMENTS

| | | | |
|---|---|---|---|
| 5,956,497 | A | 9/1999 | Ratzel et al. |
| 5,966,527 | A | 10/1999 | Krivokapic et al. |
| 6,172,546 | B1 | 1/2001 | Liu et al. |
| 6,182,253 | B1 | 1/2001 | Lawrence et al. |
| 6,486,716 | B1 | 11/2002 | Minami et al. |
| 6,555,872 | B1 | 4/2003 | Dennen |
| 6,586,921 | B1 | 7/2003 | Sunter |
| 6,683,484 | B1 | 1/2004 | Kueng et al. |
| 6,807,503 | B2 | 10/2004 | Ye et al. |
| 6,873,926 | B1 | 3/2005 | Diab |
| 6,882,172 | B1 | 4/2005 | Suzuki et al. |
| 6,948,388 | B1 | 9/2005 | Clayton et al. |
| 7,038,483 | B1 | 5/2006 | Suzuki et al. |
| 7,067,335 | B2 | 6/2006 | Weiner et al. |
| 7,069,458 | B1 | 6/2006 | Sardi et al. |
| 7,254,507 | B2 | 8/2007 | Dosho et al. |
| 7,288,958 | B2 | 10/2007 | Takagi |
| 7,369,893 | B2 | 5/2008 | Gunderson |
| 7,443,189 | B2 | 10/2008 | Ramappa |
| 7,455,450 | B2 | 11/2008 | Liu et al. |
| 7,501,832 | B2 | 3/2009 | Spuhler et al. |
| 7,612,603 | B1 | 11/2009 | Petricek et al. |
| 7,649,373 | B2 | 1/2010 | Tokunaga |
| 7,701,246 | B1 | 4/2010 | Plants et al. |
| 7,818,601 | B2 | 10/2010 | LaBerge |
| 7,877,657 | B1 | 1/2011 | Miller et al. |
| 7,940,862 | B2 * | 5/2011 | Tanaka .................. H04L 1/0045 375/316 |
| 8,001,512 | B1 | 8/2011 | White |
| 8,086,978 | B2 | 12/2011 | Zhang et al. |
| 8,170,067 | B2 | 5/2012 | Zerbe et al. |
| 8,279,976 | B2 | 10/2012 | Lin et al. |
| 8,310,265 | B2 | 11/2012 | Zjajo et al. |
| 8,365,115 | B2 | 1/2013 | Liu et al. |
| 8,418,103 | B2 | 4/2013 | Wang et al. |
| 8,479,130 | B1 | 7/2013 | Zhang et al. |
| 8,633,722 | B1 | 1/2014 | Lai |
| 8,825,158 | B2 | 9/2014 | Swerdlow |
| 8,996,937 | B2 | 3/2015 | Jain et al. |
| 9,275,706 | B2 | 3/2016 | Tam |
| 9,424,952 | B1 | 8/2016 | Seok et al. |
| 9,483,098 | B2 | 11/2016 | Bridges et al. |
| 9,490,787 | B1 | 11/2016 | Kho et al. |
| 9,536,038 | B1 | 1/2017 | Quinton et al. |
| 9,564,883 | B1 | 2/2017 | Quinton et al. |
| 9,564,884 | B1 | 2/2017 | Quinton et al. |
| 9,632,126 | B2 | 4/2017 | Yoon et al. |
| 9,714,966 | B2 | 7/2017 | Chen et al. |
| 9,760,672 | B1 | 9/2017 | Taneja et al. |
| 9,791,834 | B1 | 10/2017 | Nassar et al. |
| 9,954,455 | B2 | 4/2018 | Lin et al. |
| 9,977,078 | B2 | 5/2018 | Loke et al. |
| 9,991,879 | B2 | 6/2018 | Huang |
| 10,452,793 | B2 | 10/2019 | Joshi et al. |
| 10,490,547 | B1 | 11/2019 | Ali et al. |
| 10,509,104 | B1 | 12/2019 | Dato |
| 10,530,347 | B2 | 1/2020 | Tang et al. |
| 11,036,266 | B2 | 6/2021 | Srivastava et al. |
| 11,081,193 | B1 | 8/2021 | Tang |
| 11,409,323 | B2 | 8/2022 | Herberholz et al. |
| 11,754,604 | B2 * | 9/2023 | Medina Garcia ...... G01R 31/58 702/58 |
| 11,929,772 | B2 | 3/2024 | Seol et al. |
| 12,013,800 | B1 | 6/2024 | Fayneh et al. |
| 2001/0013111 | A1 | 8/2001 | Bishop et al. |
| 2002/0036328 | A1 | 3/2002 | Richards, Jr. et al. |
| 2004/0009616 | A1 | 1/2004 | Huisman et al. |
| 2004/0015793 | A1 | 1/2004 | Saxena et al. |
| 2004/0017234 | A1 | 1/2004 | Tam et al. |
| 2004/0230385 | A1 | 11/2004 | Bechhoefer et al. |
| 2004/0230396 | A1 | 11/2004 | Ye et al. |
| 2004/0267479 | A1 | 12/2004 | Querbach et al. |
| 2005/0053162 | A1 | 3/2005 | Goishi |
| 2005/0104175 | A1 | 5/2005 | Itano et al. |
| 2005/0114056 | A1 | 5/2005 | Patel et al. |
| 2005/0134350 | A1 | 6/2005 | Huang et al. |
| 2005/0134394 | A1 | 6/2005 | Liu |
| 2005/0154552 | A1 | 7/2005 | Stroud et al. |
| 2005/0193302 | A1 | 9/2005 | Arguelles et al. |
| 2005/0285646 | A1 | 12/2005 | Rashid |
| 2006/0049886 | A1 | 3/2006 | Agostinelli, Jr. et al. |
| 2006/0224374 | A1 | 10/2006 | Kwon et al. |
| 2007/0022397 | A1 | 1/2007 | Darsow et al. |
| 2007/0110199 | A1 | 5/2007 | Momtaz et al. |
| 2007/0182456 | A1 | 8/2007 | Agarwal et al. |
| 2007/0288183 | A1 | 12/2007 | Bulkes et al. |
| 2008/0071489 | A1 | 3/2008 | Wissel |
| 2008/0074521 | A1 | 3/2008 | Olsen |
| 2008/0144243 | A1 | 6/2008 | Mariani et al. |
| 2008/0147355 | A1 | 6/2008 | Fields et al. |
| 2008/0183409 | A1 | 7/2008 | Roberts et al. |
| 2008/0186001 | A1 | 8/2008 | Singh et al. |
| 2008/0186044 | A1 | 8/2008 | Singh |
| 2008/0216033 | A1 | 9/2008 | Bucossi et al. |
| 2008/0231310 | A1 | 9/2008 | Vijayaraghavan et al. |
| 2008/0262769 | A1 | 10/2008 | Kadosh et al. |
| 2009/0027077 | A1 | 1/2009 | Vijayaraghavan et al. |
| 2009/0044160 | A1 | 2/2009 | Bueti et al. |
| 2009/0076753 | A1 | 3/2009 | Vijayaraghavan et al. |
| 2009/0096495 | A1 | 4/2009 | Keigo |
| 2009/0105978 | A1 | 4/2009 | Schuttert et al. |
| 2009/0183043 | A1 | 7/2009 | Niwa |
| 2009/0222775 | A1 | 9/2009 | Idgunji et al. |
| 2009/0230947 | A1 | 9/2009 | Sumita |
| 2009/0244998 | A1 | 10/2009 | Kim |
| 2009/0273550 | A1 | 11/2009 | Vieri et al. |
| 2009/0278576 | A1 | 11/2009 | Chakravarty |
| 2009/0306953 | A1 | 12/2009 | Liu et al. |
| 2010/0122104 | A1 | 5/2010 | Defazio et al. |
| 2010/0153896 | A1 | 6/2010 | Sewall et al. |
| 2010/0251046 | A1 | 9/2010 | Mizuno et al. |
| 2010/0253382 | A1 | 10/2010 | Wang et al. |
| 2011/0093830 | A1 | 4/2011 | Chen et al. |
| 2011/0102091 | A1 | 5/2011 | Yeric |
| 2011/0109377 | A1 | 5/2011 | Fujibe et al. |
| 2011/0113298 | A1 | 5/2011 | Van Den Eijnden |
| 2011/0169537 | A1 | 7/2011 | Ma |
| 2011/0175658 | A1 | 7/2011 | Nomura |
| 2011/0187433 | A1 | 8/2011 | Baumann et al. |
| 2011/0267096 | A1 | 11/2011 | Chlipala et al. |
| 2011/0295403 | A1 | 12/2011 | Higuchi et al. |
| 2011/0315986 | A1 | 12/2011 | Kaneda et al. |
| 2012/0025846 | A1 | 2/2012 | Minas et al. |
| 2012/0038388 | A1 | 2/2012 | Tseng et al. |
| 2012/0051395 | A1 | 3/2012 | Chen et al. |
| 2012/0063524 | A1 | 3/2012 | Stott et al. |
| 2012/0074973 | A1 | 3/2012 | Baldwin et al. |
| 2012/0163074 | A1 | 6/2012 | Franca-Neto et al. |
| 2012/0170616 | A1 | 7/2012 | Tsai et al. |
| 2012/0187991 | A1 | 7/2012 | Sathe et al. |
| 2012/0212246 | A1 | 8/2012 | Benjamin et al. |
| 2012/0217976 | A1 | 8/2012 | Clarkson |
| 2012/0221906 | A1 | 8/2012 | Shetty et al. |
| 2012/0242490 | A1 | 9/2012 | Ramaswami |
| 2013/0088256 | A1 | 4/2013 | Chlipala et al. |
| 2013/0226491 | A1 | 8/2013 | Miguelanez, II et al. |
| 2013/0241690 | A1 | 9/2013 | Wallace et al. |
| 2013/0293270 | A1 | 11/2013 | Lee et al. |
| 2013/0335875 | A1 | 12/2013 | Baumann |
| 2014/0132293 | A1 | 5/2014 | Abadir et al. |
| 2014/0132315 | A1 | 5/2014 | Sharma et al. |
| 2014/0143586 | A1 | 5/2014 | Dalumi et al. |
| 2014/0184243 | A1 | 7/2014 | Iyer et al. |
| 2014/0254734 | A1 | 9/2014 | Abdelmoneum et al. |
| 2015/0061707 | A1 | 3/2015 | Balasubramanian et al. |
| 2015/0061721 | A1 | 3/2015 | Jeong et al. |
| 2015/0077136 | A1 | 3/2015 | Li |
| 2015/0100815 | A1 | 4/2015 | Xanthopoulos et al. |
| 2015/0121158 | A1 | 4/2015 | Wang et al. |
| 2015/0199223 | A1 | 7/2015 | Banerjee et al. |
| 2015/0332451 | A1 | 11/2015 | Amzaleg et al. |
| 2015/0355033 | A1 | 12/2015 | Zhang et al. |
| 2015/0365049 | A1 | 12/2015 | Ozawa et al. |
| 2016/0033574 | A1 | 2/2016 | Serrer et al. |

(56) References Cited

U.S. PATENT DOCUMENTS

| | | | |
|---|---|---|---|
| 2016/0042784 | A1 | 2/2016 | Rim et al. |
| 2016/0072511 | A1 | 3/2016 | Maekawa |
| 2016/0087643 | A1 | 3/2016 | Nozaki |
| 2016/0125434 | A1 | 5/2016 | Kohn et al. |
| 2016/0131708 | A1 | 5/2016 | Huang et al. |
| 2016/0153840 | A1 | 6/2016 | Huang et al. |
| 2016/0156176 | A1 | 6/2016 | Kunz, Jr. et al. |
| 2016/0164503 | A1 | 6/2016 | Kim et al. |
| 2016/0203036 | A1 | 7/2016 | Mezic et al. |
| 2016/0254804 | A1 | 9/2016 | Meng |
| 2016/0373098 | A1 | 12/2016 | Prasad et al. |
| 2017/0038265 | A1 | 2/2017 | Abdelmoneum et al. |
| 2017/0093399 | A1* | 3/2017 | Atkinson ........... H03K 19/0016 |
| 2017/0160339 | A1 | 6/2017 | Jenkins |
| 2017/0179173 | A1 | 6/2017 | Mandai et al. |
| 2017/0199089 | A1 | 7/2017 | Fritchman et al. |
| 2017/0199228 | A1 | 7/2017 | Hsieh et al. |
| 2017/0214516 | A1 | 7/2017 | Rivaud et al. |
| 2017/0329391 | A1 | 11/2017 | Jaffari et al. |
| 2017/0344102 | A1 | 11/2017 | Kolla et al. |
| 2017/0345490 | A1 | 11/2017 | Yoshimoto et al. |
| 2017/0364818 | A1 | 12/2017 | Wu et al. |
| 2018/0034549 | A1 | 2/2018 | Kikuchi |
| 2018/0109245 | A1 | 4/2018 | Takagi |
| 2018/0122666 | A1* | 5/2018 | Kim ................. G01R 31/31901 |
| 2018/0183413 | A1 | 6/2018 | Wong et al. |
| 2018/0365974 | A1 | 12/2018 | Haas et al. |
| 2019/0019096 | A1 | 1/2019 | Yoshida et al. |
| 2019/0095564 | A1* | 3/2019 | Atsatt ................ H03K 19/1776 |
| 2019/0117122 | A1 | 4/2019 | Kurachi et al. |
| 2019/0128961 | A1 | 5/2019 | Heron et al. |
| 2019/0162783 | A1 | 5/2019 | Huang |
| 2019/0187204 | A1 | 6/2019 | Doescher et al. |
| 2019/0196564 | A1 | 6/2019 | Murtagh et al. |
| 2019/0265767 | A1 | 8/2019 | Mehra et al. |
| 2019/0302830 | A1 | 10/2019 | Chen et al. |
| 2019/0305074 | A1 | 10/2019 | Kande et al. |
| 2020/0028514 | A1 | 1/2020 | Hanke et al. |
| 2020/0203333 | A1 | 6/2020 | Chen et al. |
| 2020/0209070 | A1 | 7/2020 | Tang et al. |
| 2020/0309850 | A1 | 10/2020 | Bismuth |
| 2020/0313664 | A1 | 10/2020 | Azam et al. |
| 2020/0393506 | A1* | 12/2020 | Landman ........... G01R 31/3016 |
| 2021/0181251 | A1 | 6/2021 | Hsieh et al. |
| 2021/0325455 | A1 | 10/2021 | Fayneh et al. |
| 2021/0341535 | A1 | 11/2021 | Hsieh et al. |
| 2022/0260630 | A1 | 8/2022 | Fayneh et al. |
| 2022/0349935 | A1* | 11/2022 | Fayneh .............. G01R 31/2881 |
| 2022/0349938 | A1 | 11/2022 | Vezyrtzis et al. |
| 2023/0098071 | A1 | 3/2023 | Chonnad et al. |

FOREIGN PATENT DOCUMENTS

| | | | |
|---|---|---|---|
| CN | 101241429 | A | 8/2008 |
| CN | 101344898 | A | 1/2009 |
| CN | 102422169 | A | 4/2012 |
| CN | 101915625 | B1 | 7/2012 |
| CN | 102273077 | B | 9/2014 |
| CN | 105210188 | A | 12/2015 |
| CN | 106959400 | A | 7/2017 |
| CN | 108534866 | A | 9/2018 |
| CN | 113466670 | A | 10/2021 |
| DE | 102007002253 | A1 | 7/2007 |
| DE | 102012219971 | A1 | 5/2013 |
| DE | 102014216786 | B3 | 10/2015 |
| EP | 962991 | A1 | 12/1999 |
| EP | 1262755 | A1 | 12/2002 |
| EP | 2006784 | A1 | 12/2008 |
| EP | 2413150 | A1 | 2/2012 |
| EP | 2060924 | B1 | 10/2013 |
| EP | 2770313 | A1 | 8/2014 |
| JP | 57116228 | A | 7/1982 |
| JP | 2000215693 | A | 8/2000 |
| JP | 2002243800 | A | 8/2002 |
| JP | 2008147245 | A | 6/2008 |
| JP | 2009021348 | A | 1/2009 |
| JP | 2009065533 | A | 3/2009 |
| JP | 2009074921 | A | 4/2009 |
| JP | 2011204328 | A | 10/2011 |
| JP | 2012037238 | A | 2/2012 |
| JP | 2012088322 | A | 5/2012 |
| JP | 2014085348 | A | 5/2014 |
| JP | 2016111563 | A | 6/2016 |
| KR | 101232207 | B1 | 2/2013 |
| KR | 20130110989 | A | 10/2013 |
| KR | 20150073199 | A | 6/2015 |
| TW | 200914841 | A | 4/2009 |
| TW | 201614256 | A | 3/2016 |
| TW | 201709669 | A | 3/2017 |
| WO | 2005080099 | A1 | 9/2005 |
| WO | 2013070218 | A1 | 5/2013 |
| WO | 2013027739 | A1 | 3/2015 |
| WO | 2019097516 | A1 | 5/2019 |
| WO | 2019102467 | A1 | 5/2019 |
| WO | 2019135247 | A1 | 7/2019 |
| WO | 2019202595 | A1 | 10/2019 |
| WO | 2019244154 | A1 | 12/2019 |
| WO | 2020141516 | A1 | 7/2020 |
| WO | 2020230130 | A1 | 11/2020 |
| WO | 2021019539 | A1 | 2/2021 |
| WO | 2021111444 | A1 | 6/2021 |
| WO | 2021214562 | A1 | 10/2021 |
| WO | 2022009199 | A1 | 1/2022 |
| WO | 2022215076 | A1 | 10/2022 |
| WO | 2023084528 | A1 | 5/2023 |
| WO | 2023084529 | A1 | 5/2023 |
| WO | 2023238128 | A1 | 12/2023 |
| WO | 2024142056 | A1 | 7/2024 |
| WO | 2024/166103 | A1 | 8/2024 |

OTHER PUBLICATIONS

B. Zandian et al, "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.

W. Shan et al, "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.

X. Shang et al, "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.

Youhua Shi et al, "Suspicious timing error prediction with in-cycle clock gating"; International Symposium on Quality Electronic Design (ISQED), pp. 335-340, Mar. 4-6, 2013. doi: 10.1109/ISQED.2013.6523631.

Youhua Shi et al, "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.

J. Li et al, "Robust and in-situ self-testing technique for monitoring device aging effects in pipeline circuits"; 2014 51st ACM/EDAC/IEEE Design Automation Conference (DAC), pp. 1-6, Jun. 1-5, 2014.

Liangzhen Lai et al, "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.

Martin Wirnshofer et al, "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.

Jongho Kim et al., "Adaptive delay monitoring for wide voltage-range operation"; 2016 Design, Automation & Test in Europe Conference & Exhibition (DATE), pp. 511-516, Mar. 14-18, 2016.

(56) References Cited

OTHER PUBLICATIONS

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. doi: 10.1109/TVLSI.2014.2364785.
Fayneh et al. U.S. Appl. No. 18/367,333, filed Sep. 12, 2023, 35pp.
Fayneh et al. U.S. Appl. No. 18/406,164, filed Jan. 7, 2024, 31pp.
Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016. doi: 10.1109/ESSCIRC.2016.7598293.
Kan Takeuchi et al; "Wear-out stress monitor utilising temperature and voltage sensitive ring oscillators" IET Circuits, Devices & Systems. vol. 12 No. 2, pp. 182-188, Jan. 15, 2018. https://doi.org/10.1049/iet-cds.2017.0153.
Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019. pp. 1-7, doi: 10.1109/IRPS.2019.8720583.
Dan Ernst et al; "Razor: circuit-level correction of timing errors for low-power operation," in IEEE Micro, vol. 24, No. 6, pp. 10-20, Nov.-Dec. 2004, doi: 10.1109/MM.2004.85.
Dan Ernst et al; "Razor: A Low-Power Pipeline Based on Circuit-Level Timing Speculation"; Appears in the 36th Annual International Symposium on Microarchitecture (MICRO-36). Dec. 1, 2003. pp. 7-18, doi: 10.1109/MICRO.2003.1253179.
James P. Hofmeister, et al., "Ball Grid Array (BGA) Solder Joint Intermittency Detection: SJ BIST™", IEEE Aerospace Conference Proceedings, Apr. 2008, paper #1148, Version 1. pp. 1-11, doi: 10.1109/AERO.2008.4526624.
Paulheim, H. & Meusel, R. "A decomposition of the outlier detection problem into a set of supervised learning problems", Machine Learning, Sep. 2015, vol. 100 Issue 2, pp. 509-531. https://doi.org/10.1007/s10994-015-5507-y.
Zhang L, Marron JS, Shen H, Zhu Z., "Singular value decomposition and its visualization", Journal of Computational and Graphical Statistics, Dec. 2007, vol. 6 Issue 4, pp. 833-854. https://doi.org/10.1198/106186007X256080.
Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011. doi: 10.1109/ASPDAC.2011.5722274.
Weiwei Shan et al. "An improved timing error prediction monitor for wide adaptive frequency scaling"; IEICE Electronics Express, vol. 14, No. 21, pp. 1-6, Oct. 20, 2017. DOI:10.1587/elex.14.20170808.
Agilent Technologies; "Clock Jitter Analysis with femto-second resolution"; Jan. 1, 2008.
Yousuke Miyake et al; "Temperature and voltage estimation using ring-oscillator-based monitor for field test"; IEEE 23rd Asian Test Symposium; pp. 156-161, Nov. 16, 2014. doi: 10.1109/ATS.2014.38.
Basab Datta at al; "Analysis of a ring oscillator based on chip thermal sensor in 65nm technology"; Online at: https://web.archive.org/web/20140328234617/http://www-unix.ecs.umass.edu/~dkumar/lab4_658_report/lab4_report.htm; Sep. 5, 2018.
Tilman Wolf et al; "Collaborative Monitors for Embedded System Security". Jan. 1, 2006. First Workshop on Embedded Security in conjunction with EMSOFT '06, Oct. 6, 2006 Seoul, South Korea.
Sandeep Kumar Samal et al; "Machine Learning Based Variation Modeling and Optimization for 3D ICs"; J. Inf. Commun. Converg. Eng. 14(4): 258-267, Dec. 2016. http://doi.org/10.6109/jicce.2016.14.4.258.
Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015. doi: 10.3390/jlpea5020101.
Yong Zhao et al; "A Genetic Algorithm Based Remaining Lifetime Prediction for a VLIW Processor Employing Path Delay and IDDX Testing"; IEEE; Apr. 12, 2016.
Vivek S Nandakumar et al, "Statistical static timing analysis flow for transistor level macros in a microprocessor"; 2010, 11th International Symposium on Quality Electronic Design (ISQED), pp. 163-170, Mar. 22, 2010. doi: 10.1109/ISQED.2010.5450412.
Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009. doi: 10.1109/TCAD.2008.2009149.
Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014. doi: 10.1109/ICCD.2014.6974709.
Rebaud B et al. ,"Timing slack monitoring under process and environmental variations: Application to a DSP performance optimization"; Microelectronics Journal vol. 42 Issue 5, pp. 718-732, Feb. 8, 2011. https://doi.org/10.1016/j.mejo.2011.02.005.
Dierickx B et al., "Propagating variability from technology to system Level"; Physics of Semiconductor Devices, pp. 74-79, Dec. 16, 2007. doi: 10.1109/IWPSD.2007.4472457.
Zheng K., "A Comparison of Digital Droop Detection Techniques in ASAP7 FinFET"; Research Review. Sep. 2019.
Hongge Chen, "Novel Machine Learning Approaches for Modeling Variations in Semiconductor Manufacturing," [Master's thesis, Tsinghua University] Jun. 2017.
Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83. 10.1109/FDTC.2009.40. hal-00410135.
Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190. doi: 10.1049/iet-ifs.2010.0238.
Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.
I. A. K. M. Mahfuzul et al, "Variation-sensitive monitor circuits for estimation of Die-to-Die process variation"; 2011 IEEE ICMTS International Conference on Microelectronic Test Structures; pp. 153-157, Apr. 4-7, 2011. doi: 10.1109/ICMTS.2011.5976878.
Ying Qiao et al, "Variability-aware compact modeling and statistical circuit validation on SRAM test array"; Proceedings vol. 9781, Design-Process-Technology Co-optimization for Manufacturability X, Mar. 16, 2016. DOI: 10.1117/12.2219428.
David Herres, "The Eye Diagram: What is it and why is it used?"; Online at: https://www.testandmeasurementtips.com/basics-eye-diagrams/, Aug. 16, 2016.
Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.
Mridul Agarwal et al, "Circuit Failure Prediction and Its Application to Transistor Aging"; 5th IEEE VLSI Test Symposium (VTS'07), pp. 277-286, May 6-10, 2007. doi: 10.1109/VTS.2007.22.
Keith A. Bowman et al, "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.
Shidhartha Das et al, "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.
Shidhartha Das et al, "RazorII: In Situ Error Detection and Correction for PVT and SER Tolerance" 2008 IEEE International Solid-State Circuits Conference—vol. 44, No. 1, pp. 32-48, Jan. 2009, doi: 10.1109/JSSC.2008.2007145.

(56) References Cited

OTHER PUBLICATIONS

Ramyanshu Datta et al, "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.

Alan Drake et al, "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.

Matthias Eireiner et al, "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.

Matthew Fojtik et al, "Bubble Razor: An architecture-independent approach to timing-error detection and correction"; 2012 IEEE International Solid-State Circuits Conference; Feb. 19-23, 2012. pp. 488-490, doi: 10.1109/ISSCC.2012.6177103.

Matthew Fojtik et al, "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.

Piero Franco et al, "On-Line Delay Testing of Digital Circuits"; Proceedings of IEEE VLSI Test Symposium; Apr. 25-28, 1994. pp. 167-173, doi: 10.1109/VTEST.1994.292318.

V. Huard et al, "Adaptive Wearout Managment with In-Situ Aging Monitors"; 2014 IEEE International Reliability Physics Symposium; Jun. 1-5, 2014. pp. 6B.4.1-6B.4.11, doi: 10.1109/IRPS.2014.6861106.

Liangzhen Lai et al, "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.

M. Saliva et al, "Digital Circuits Reliability with In-Situ Monitors in 28nm Fully Depleted SOI"; 2015 Design, Automation & Test in Europe Conference & Exhibition (DATE), Mar. 9-13, 2015. pp. 441-446, doi: 10.7873/DATE.2015.0238.

Martin Wirnshofer et al, "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.

Martin Wirnshofer et al, "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.

Martin Wirnshofer et al, "On-line supply voltage scaling based on in situ delay monitoring to adapt for PVTA variations"; Journal of Circuits, Systems and Computers; vol. 21, No. 08, Mar. 7, 2012. DOI: 10.1142/S0218126612400270.

S. Mhira et al, "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.

A. Benhassain et al, "Early failure prediction by using in-situ monitors: Implementation and application results"; Online at: https://ceur-ws.org/Vol-1566/Paper6.pdf, Mar. 18, 2016.

Charles R. Lefurgy et al, "Active Management of Timing Guardband to Save Energy in POWER7"; 2011 44th Annual IEEE/ACM International Symposium on Microarchitecture (MICRO); pp. 1-11; Dec. 3-7, 2011.

Borivoje Nikolic et al, "Technology Variability From a design Perspective"; IEEE Transactions on Circuits and Systems I: Regular Papers; vol. 58, Issue: 9, pp. 1996-2009, Sep. 8, 2011—14 Pages.

Tamas Virosztek, "Maximum likelihood estimation of ADC parameters"; pp. 1-67, Dec. 19, 2013—67 Pages.

* cited by examiner

* alternatively, a logical XOR combiner
or a Hamming parity combiner

INTEGRATED CIRCUIT MARGIN MEASUREMENT FOR THE DETECTION OF RARE EVENTS

FIELD OF THE INVENTION

The invention relates to the field of semiconductor integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, that have commoditized the production of ICs, such as complementary metal-oxide-semiconductor (CMOS) ICs. Digital ICs contain billions of transistors arranged in functional and/or logical units on the wafer, with data-paths interconnecting the functional units that transfer data values between the functional units. As used herein, the term "data-path" means a parallel series of electronic connections, or paths, for transferring data signals between functional/logical units of an IC, and each data-path may include a specific number of bit paths, such as 64, 128, 256, ort the like. During the IC design process, the timing of the functional units is arranged so that each functional unit may usually complete the required processing of that unit within a single clock cycle. A safety factor may be used to account for manufacturing differences of individual ICs and possible changes, such as degradations, over the planned lifetime of the IC.

The degrading of an IC's transistors over time is termed aging. For example, the degradation of transistors over time leads slowly to decreased switching speeds, and may even result in outright circuit failures, when they exceed the design safety factors. Usually, the design process incorporates these delays into the design such that the ICs will not fail during their normal lifetime, but environmental and usage conditions (such as heat, voltage, current, humidity, and/or the like) may accelerate the aging process.

IC transistors, such as bipolar transistors, metal-oxide semiconductor field-effect transistors (MOSFETs), and/or the like, may be used in digital ICs and may function as electrical switches. For example, a MOSFET may have four terminals, such as the body, the gate, the source, and the drain, yet typically the source and body are electrically connected. The voltage applied to the gate may determine the amount of current that flows between the source and drain. A thin layer of dielectric material electrically insulates the gate, and the electric field applied across the gate may alter the conductivity of the underlying semiconductor channel between the source and drain.

With use, charge carriers (such as electrons for negative, or n-channel, MOSFETs, or holes for positive, or p-channel, MOSFETs) that have more energy than the average charge carrier may stray out of the conductive channel between the source and drain, and become trapped in the insulating dielectric. This process, termed hot-carrier injection (HCI), may eventually build up electric charge within the dielectric layer, and thus increase the voltage needed to operate the transistor. As the threshold voltage increases, the transistor switching delay may become larger.

Another aging mechanism occurs when a voltage is applied to the gate, a phenomenon termed bias temperature instability (BTI). BTI may cause a buildup of charge in the dielectric, among other issues, though, some of this effect spontaneously disappears after that gate voltage is removed. This recovery occurs within a few microseconds, making it difficult to observe when a transistor is stressed and then the resulting effects are measured only after the stress is removed.

Another aging mechanism comes into play when a voltage applied to the gate may create electrically active defects, known as traps, within the dielectric. When traps become too numerous, these charge traps may join and form an outright short circuit between the gate and the current channel. This kind of failure is termed oxide breakdown, or time-dependent dielectric breakdown. Unlike the other aging mechanisms, which cause a gradual decline in performance, the breakdown of the dielectric may lead to a catastrophic failure of the transistor, causing the IC to malfunction.

Additionally, a phenomenon called electromigration may damage the copper or aluminum connections that tie transistors together or link them to the outside world. Electromigration may occur when a surge of current knocks metal atoms loose from the electrical connections, and may cause them to flow with the electrons. This depletes the metal of some atoms upstream, while causing a buildup of metal downstream. The upstream thinning of the metal increases the electrical resistance of the connection, sometimes becoming an open circuit. The downstream deposition may cause the metal to bulge out of its designated track.

Another reliability related issue in ICs is a phenomenon called stress migration. This is used to describe the flow of metal atoms under the influence of mechanical stress.

Additionally, any defect, such as un-modeled phenomenon, random manufacturing defects, and/or the like, may cause a timing degradation of a signal path over time. Some defects may not appear during testing, verification, initial operation, and/or the like, for example, the die/IC/product may pass all the screening procedures at the testing stage. For example, a via that includes a manufacturing defects, such as less that complete metal coverage, will increase its resistance over time and at some point, causes a timing failure of a logic path. For example, random manufacturing defects may appear anywhere on the IC, and incorporate a large variety of types and levels of defects, so designs may not be able to incorporate safety factors to mitigate these defects. On the other hand, aspects of embodiments of the disclosed techniques may be able to predict the failure of each individual IC based on fingerprint sampling at appropriate IC pathways, and mitigate the failure by preemptive replacement, corrective and preventative actions, notifications to users, compensations within the IC to increase time lifetime, and/or the like.

The term "timing margin," or simply "margin," describes the difference between (a) a timing delay exhibited by a certain data path in an IC, and (b) such timing delay that will cause failure because it prevents a data signal transmitted over the data path from finishing its propagation within a single clock cycle. For example, for a 0.5 nanoseconds (ns)-long clock cycle of a IC clocked at 2 GHz, and a timing delay of 0.45 ns exhibited by a certain data path, the margin is 0.05 ns. If the timing delay of that data path increases (for example, due to aging of microelectronic components of that data path) by more than an additional 0.05 ns, any data signal transmitted over that data path will not manage to propagate within a single clock cycle, leading to failure (also known as a "timing violation"). Accordingly, an exemplary IC should be designed, manufactured, and configured with certain frequency and voltage such that its margin (for example, 0.05 ns in the above case) is long enough to permit the IC to operate for its intended lifetime. A longer margin may be needed for ICs intended for lengthier field operations, or for ICs estimated to experience greater stress.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided a sensor, system and/or method for measuring a specific logic circuitry of a semiconductor integrated circuit (IC) in accordance with independent claims 1, 17 and 21. A non-transitory computer readable medium having stored thereon a computer-readable encoding of a sensor for measurement in a semiconductor IC is defined in independent claim 23. Further embodiments are defined in the corresponding dependent claims. The description and drawings also present additional aspects, examples, implementations and non-claimed embodiments for the better understanding of the claimed embodiments.

According to a first aspect, there is provided a sensor for measuring a specific logic circuitry of a semiconductor Integrated Circuit (IC), comprising: a signal splitter, configured to split a signal from the specific logic circuitry into two test paths; a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value; a comparison circuit configured to compare the delayed first test path and a second of the two test paths and provide a measurement output according to the comparison for an instance of measuring; and a controller, configured to set the predetermined timing margin such that, over a plurality of the instances of measuring, a frequency of selection of the shortest timing margin value is higher than a frequency of selection of each of the at least one longer timing margin value.

In embodiments, the sensor is configured to complete each of the plurality of instances of measuring over a same number of clock cycles of the semiconductor IC.

In embodiments, the controller is configured to select the respective predetermined timing margin for each measuring over successive instances of the plurality of instances from the group of discrete timing margin values according to a predetermined sequence, the predetermined sequence being defined such that the frequency of selection of the shortest timing margin value is higher than the frequency of selection of each of the at least one longer timing margin value.

In embodiments, the predetermined sequence repeats each predefined number of instances.

In embodiments, the sensor is local to the specific logic circuitry.

In embodiments, the comparison circuit comprises a logic gate configured to receive a signal from the delayed first test path and a signal from the second test path as inputs.

In embodiments, the group of discrete timing margin values comprises a shortest timing margin value and a plurality of longer timing margin values.

In embodiments, the frequency of selection of the shortest timing margin value is at least a sum of frequencies of selection of each of the plurality of longer timing margin values.

In embodiments, for each of the plurality of longer timing margin values, a frequency of selection of the respective timing margin value is higher than a frequency of selection of each timing margin value longer than the respective timing margin value.

In embodiments, for each of the plurality of longer timing margin values, the ratio of the frequency of selection of the shortest timing margin value to the frequency of selection of the respective longer timing margin value is inversely proportional to the ratio of the shortest timing margin value to the respective longer timing margin value.

In embodiments, the plurality of longer timing margin values are defined as a sequence, each longer timing margin value in the sequence being double a preceding longer timing margin value in the sequence.

In embodiments, the measuring is performed on a combined data path signal comprising a combination of individual data path signals, each of the individual data path signals coming from a different part of the specific logic circuitry.

In embodiments, each instance of the measuring determines if a failure condition is met for the respective predetermined timing margin, the controller being further configured to output an indication of a maximum timing margin for which the failure condition is not met and/or a minimum timing margin for which the failure condition is met, based on the determinations for the plurality of instances of the measuring.

In embodiments, the sensor further comprises: a signal path combiner, configured to combine signals from multiple data paths of the specific logic circuitry; and wherein the signal from the specific logic circuitry provided to the signal splitter comprises the combined signals.

In embodiments, the controller is configured to set the predetermined timing margin so as to apply varying delay to the signal passing through the first test path over different instances of the measurement and to determine a worst-case remaining margin of the multiple data paths, based on the comparison of the first and second test paths.

In another aspect, there is provided a system for measuring logic circuitry of a semiconductor Integrated Circuit (IC), comprising: a first sensor in accordance with any as herein described, configured to measure a first specific logic circuitry; and a second sensor in accordance with any as herein described, configured to measure a second specific logic circuitry, distinct from the first specific logic circuitry.

In a further aspect, there is provided a system for measuring a semiconductor integrated circuit (IC), the system comprising: a functional circuit of the semiconductor IC, comprising logic circuitry; and a sensor on the semiconductor IC, associated with the functional circuit and configured to receive a signal from one or more data paths of the logic circuitry, the sensor comprising: a signal splitter, configured to split a signal from the specific logic circuitry into two test paths; a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value; a comparison circuit configured to compare the delayed first test path and a second of the two test paths and provide a measurement output according to the comparison for an instance of measuring; and wherein the system is configured to set the predetermined timing margin such that, over a plurality of instances of the measurement, a frequency of selection of the shortest timing margin value is higher than a frequency of selection of each of the at least one longer timing margin value.

In embodiments, the system is configured to set the predetermined timing margin using a controller on the semiconductor IC and/or an interface external the semiconductor IC.

In embodiments, the system is further configured to determine a timing margin of the functional circuit based on the plurality of instances of the measurement and to set a clock of the semiconductor IC based on the determined timing margin.

In embodiments, the system is configured to set the frequency of the clock of the semiconductor IC and/or the voltage of the semiconductor IC using one or more of: an Automatic Voltage Scaling (AVS) mechanism; an Automatic Frequency Scaling mechanism (AFS); and a Dynamic Voltage and Frequency Scaling (DVFS) mechanism.

In a yet further aspect, there is provided a method for measuring a specific logic circuitry of a semiconductor Integrated Circuit (IC), the method comprising: splitting a signal from the specific logic circuitry into two test paths; applying a delay to a first of the two test paths, the delay being based on a predetermined timing margin that is selected from a group of discrete timing margin values, the group of discrete timing margin values comprising a shortest timing margin value and at least one longer timing margin value; comparing the delayed first test path and a second of the two test paths and providing a measurement output according to the comparison for an instance of measuring; and setting the predetermined timing margin such that, over a plurality of instances of the measurement, a frequency of selection of the shortest timing margin value is higher than a frequency of selection of each of the at least one longer timing margin value.

In embodiments, the method further comprises: determining a timing margin of the semiconductor IC based on the plurality of instances of the measurement; and setting a clock of the semiconductor IC based on the determined timing margin.

In yet another aspect, there is provided a non-transitory computer readable medium having stored thereon a computer-readable encoding of a sensor for measurement in a semiconductor Integrated Circuit (IC), the computer-readable encoding of the sensor comprising encodings of: a signal splitter, configured to split a signal from the specific logic circuitry into two test paths; a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value; a comparison circuit configured to compare the delayed first test path and a second of the two test paths and provide a measurement output according to the comparison for an instance of measuring; and a controller, configured to set the predetermined timing margin such that, over a plurality of instances of the measurement, a frequency of selection of the shortest timing margin value is higher than a frequency of selection of each of the at least one longer timing margin value.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
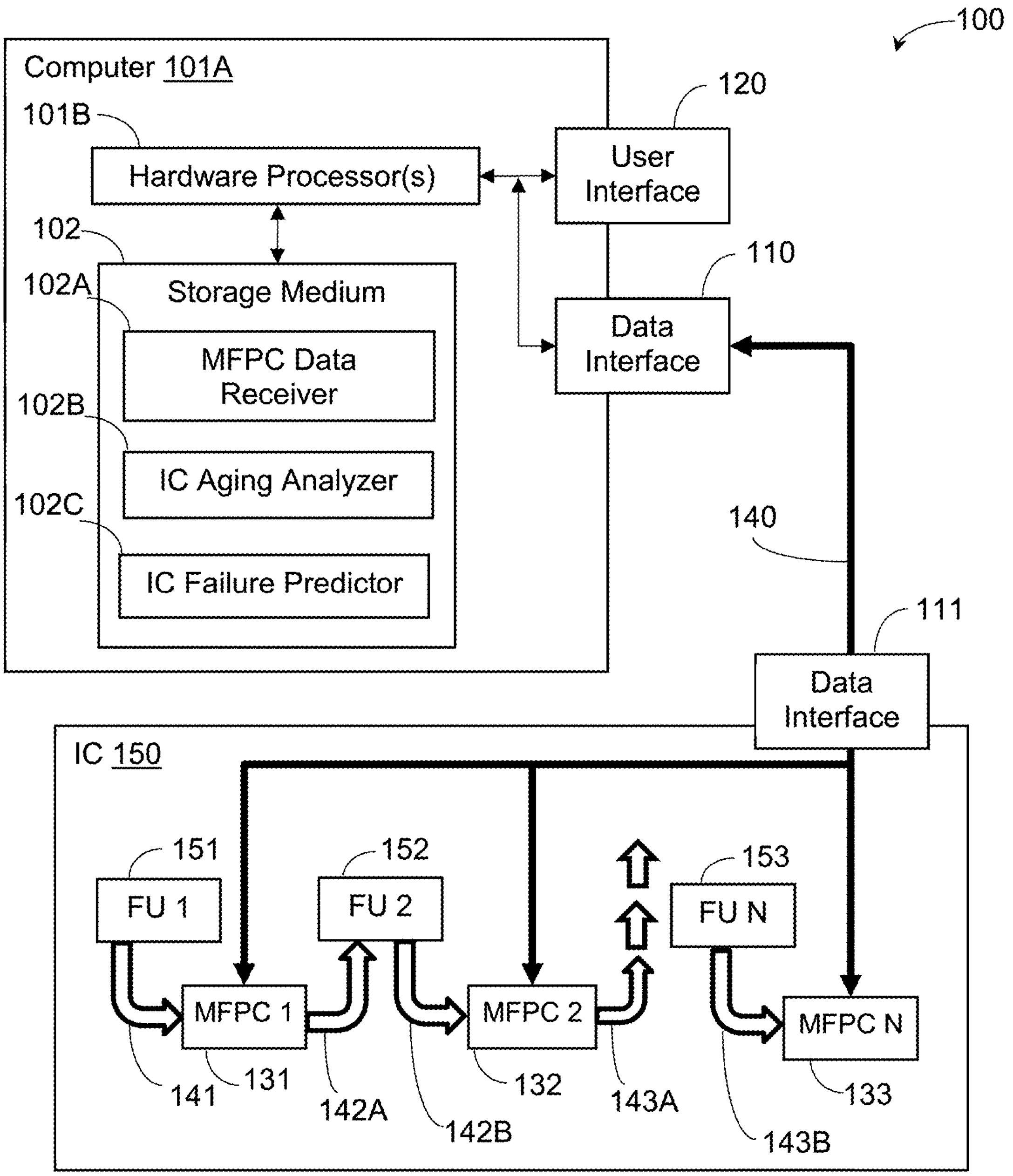
FIG. 1 shows schematically a computerized system for IC margin measurement and failure prediction.

Disclosed herein are methods and devices for determining and predicting a future failure of the individual integrated circuit. Also disclosed is a timing delay margin measurement circuit for an IC (otherwise known as a sensor or agent), from its first operation and/or over time (for example, during any time period from or subsequent to its first operation). A dedicated circuit (which may be detector), such as a failure prediction circuit (FPC) or a margin measurement and failure prediction circuit (MFPC), is placed at selected points along one or more data-paths in a digital integrated circuit (such as one or more FPC or MFPC per data-path), where each dedicated circuit combines multiple individual data paths into a fewer number of test paths. By splitting each test signal into two, and applying a delay circuit to one of the split signal paths, a fingerprint or signature of the delays of each path of the data-path may be acquired during each clock cycle of the functional unit. As used herein, the term "fingerprint" and/or "signature" mean the profile of signal strengths, such as a vector, series, and/or the like, resulting from a measurement of timing delay margins of a combination of signals of a data-path. For each clock cycle of the functional unit, the output data-path may have a different data value. Thus, during each clock cycle, a different combination of the logical paths within the functional unit may be tested, producing a different fingerprint. By collecting a large number of fingerprints over time, a dataset of fingerprints may be analyzed. The analysis of the fingerprint datasets may determine the performance and/or predict future failure of the individual IC.

The margin measurement circuit discussed below is generally in accordance with the timing delay margin measurement circuit or related devices/circuits disclosed in PCT International Publication No. WO2019/097516, entitled "Integrated Circuit Margin Measurement and Failure Prediction Device," which is incorporated herein by reference. Generally, the margin measurement circuit may include the following main components: a signal path combiner configured to combine signals from the multiple data paths into a single signal; a signal splitter configured to split the combined signal into two test paths; a delay circuit configured to (gradually) apply varying levels of delay to signals passing through a first one of the two test paths; a comparation circuit configured to determine whether a failure condition is met based on a comparison between the first test path and a second one of the two test paths. Based on multiple comparisons, each with different levels of delay applied, the worst-case remaining margin of the multiple data paths may be determined. The signal path combiner may, for example, either combine signals received on multiple paths (for example, if the signal path combiner is a XOR element), or select signals received on multiple paths (for example, if the signal path combiner is a multiplexer). Where the signal path combiner combines signals received on multiple paths (in the form of a XOR element, for instance) the combining operation itself may reveal the shortest margin amongst all input paths to the combiner. If the signal path combiner selects signals received on multiple paths (for example, using a multiplexer), each input path may be selected individually, such that only after the margin of all paths has been determined can the shortest be identified. The present disclosure expands on these disclosures.

PCT International Publication No. WO2019/097516 generally describes a semiconductor integrated circuit (IC) comprising: a signal path combiner, comprising a plurality of input paths (for example to receive signals on a data source or data-path, from a memory circuit and/or from logic circuits grouped by a clock enable) and an output, the output being based on a combination of respective signals received on each of the input paths; a delay circuit having an input electronically connected to the signal path combiner output, the delay circuit delaying an input signal by a variable delay time to output a delayed signal; and a comparison circuit arranged to provide a comparison output based on a comparison of the signal path combiner output and the delayed signal, wherein the comparison output is provided in a comparison data signal to at least one mitigation circuit. The combination of the signal path combiner, delay circuit and comparison circuit may provide an FPC or MFPC.

A method for using such an IC may also be considered (in which using may comprise one of more of operating, analyzing and configuring, for instance). For instance, this may include a method for using a semiconductor integrated circuit (IC). The method may comprise: combining respective signals received on each of a plurality of input paths at a signal path combiner to provide an output; delaying the signal path combiner output by a variable delay time at a delay circuit to output a delayed signal; and comparing the signal path combiner output and the delayed signal to provide a comparison output and providing the comparison output in a comparison data signal to at least one mitigation circuit.

It may also be considered that the steps of combining, delaying and comparing may be repeated for each of a plurality of delay times. In this way, a plurality of comparison outputs may be provided. An identifying characteristic (i.e. a signature or fingerprint) for the IC may thereby be determined based on the plurality of comparison outputs. By repeating this process over different clock cycles, multiple such fingerprints may be determined. The fingerprints may then be tracked at different times, for example by tracking changes in the fingerprint over time (using intervals at least as long as the length of time taken to determine a single fingerprint and likely longer).

Further optional method features corresponding with the steps implemented by any of the features described with reference to the IC may also be provided. Examples of these may be discussed below. Specific embodiments will also be discussed below, but further reference will also be made to generalized senses or terms of the disclosure.

Note that a data-path is one example of a design style that can be handled by the FPC or MFPC, other examples may be memory circuits (the FPC/MFPC is located at the output of the memory) and other logic circuits that are grouped together with respect to a certain clock enable.

Optionally, aspects of embodiments described herein may be applied to any reliability problem of IC performance, such as aging, latent defects that manifest in the design and cause degradation, manufacturing differences within/between ICs, manufacturing differences between fabs, and/or the like. The techniques described may find changes in timing delays from any source or cause, predict a future failure before the IC failure causes a device/system failure, and enable corrective and preventive action before the specific IC failure. While reliability issues, such as aging, electro-migration, and/or the like, are used here as examples, the techniques may also be applied to latent defects, such as random defects, systematic defects, unknown defects, and/or the like.

Optionally, the delay me be changed in small time steps, producing one or more sweeps of time delays, and associated fingerprints at each different time delay. The sweep may be analyzed to determine the operation of the individual IC, predict a future failure of the IC, and/or the like.

Optionally, one or more datasets (e.g. from signals on the IC) may be analyzed combinatorically to determine the operational delays of each path of the data-path (or equivalent signal path), each logical processing path of the functional unit, and/or the like.

Optionally, one or more datasets may be analyzed statistically to predict a future failure the IC. For example, an IC degradation trend may be analyzed in one or more delay margins measured using the failure prediction circuit, such as be analyzing a minimum delay margin change over time.

Optionally, one or more datasets may be analyzed using machine learning to monitor the failure of the IC, predict a future failure of the IC, and/or the like.

Optionally, one or more datasets may be analyzed to design a future IC.

Optionally, one or more sweeps may be analyzed combinatorically to determine the operational delays of each path of the data-path, each logical processing path of the functional unit, and/or the like.

Optionally, one or more sweeps may be analyzed statistically to predict a future failure the IC. For example, a regression analysis of one or more sweeps determines the changes in timing delays, and an extrapolation to a timing delay failure value determines the time to failure.

Optionally, one or more sweeps may be analyzed using machine learning to monitor the failure of the IC, predict a future failure of the IC, and/or the like.

Optionally, one or more delay time sweeps may be analyzed to design a future IC, where the future IC is designed to avoid the failures of the previous ICs.

Optionally, one or more sweeps are analyzed using machine learning at the beginning-of-life of the chip, e.g. the timing delay margins signature or fingerprint of the IC at the beginning-of-life. The signature or fingerprint may be used for chip outlier detection/screening, i.e. a specific IC is given a unique identity and the signature as compared to other ICs that allows detecting anomaly's in a large manufacturing scale.

Figure 2:
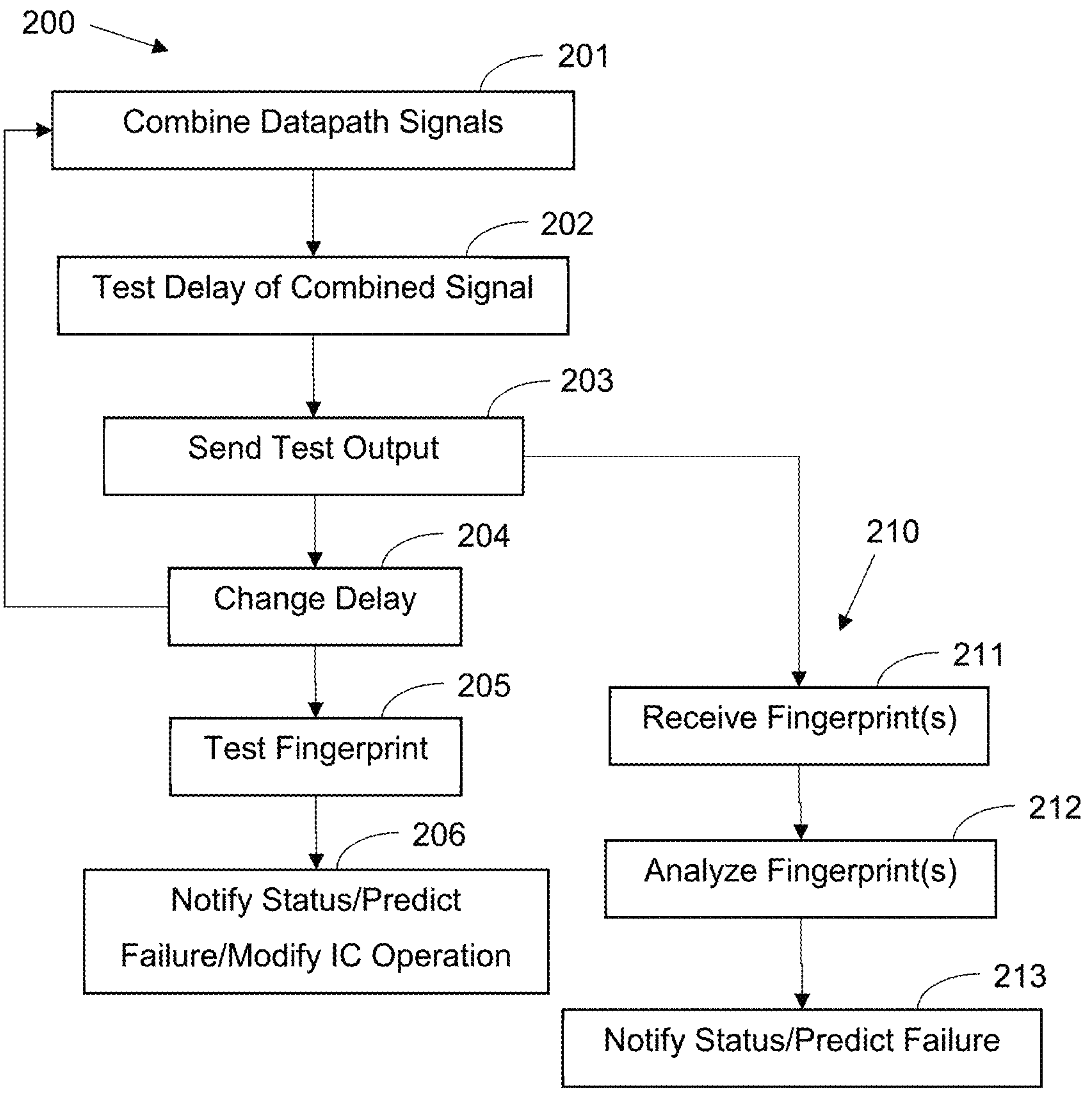
FIG. 2 shows flowcharts of methods for IC margin measurement and failure prediction.

Reference is now made to FIG. 1 and FIG. 2, which show schematically a computerized system 100 and flowcharts (200 and 210) of methods, respectively, for IC failure prediction and margin measurement of logic-paths at the IC testing (tester or system level). System 100 comprises an IC 150, a computer 101A, and a data interface connection 140 connecting the two. IC 150 comprises multiple function or functional units (as at 151, 152, 153, and the like), and data-paths (as at 141, 142A, 142B, 143A, 143B, and the like, which may include synthesized logic) between them. IC 150 comprises margin measurement and failure prediction circuits (MFPCs; as at 131, 132, 133, and the like) for capturing signals from data-paths (as at 142A, 143A, and the like), and determining delay timings of at least some signals form the respective data-path. MFPCs 131, 132, or 133 combine 201 signals from the data-path, and test 202 one or more delays of the combined signals. A clock signal is not shown in FIG. 1, but synchronous logic is typically used with a common clock signal between function units and also clocking the MFPCs. IC 150 comprises a data interface for connecting to data interface connection 140, and sending 202 the delay timings to computer 101A. Delay timing data collected for multiple signals of the data-paths and/or for multiple delay values, such as be changing 204 the delay, may be considered the fingerprint of the delay timings.

Computer 101A comprises one or more hardware processors 101B, a user interface 120 and a non-transitory, computer readable storage medium 102. Storage medium comprises program code, such as an MFPC Data Receiver 102A, an IC Aging Analyzer 102B, an IC Failure Predictor 102C, and/or the like, the program code comprising instructions that when executed on hardware processor(s) 101B, cause hardware processor(s) 101B to receive 211 the signal delay data (i.e. fingerprints) using a data interface 110, such as using MFPC Data Receiver 102A. IC Aging Analyzer 102B analyzes 212 the fingerprints, and IC Failure Predictor 102C notifies 213 an operator of a status, a failure prediction, a preventative action, and or the like, such as using user interface 120.

Optionally, the delay timings are analyzed by a circuit (not shown) of IC 150 to determine when clock and/or logic modifications 206 on IC 150 improve the lifetime of IC 150 before failure. Optionally, the delay timings are analyzed by a circuit (not shown) of IC 150 and a notification 206 is issued of the status or failure prediction.

Optionally, the delay timing fingerprint may be generated at the IC testing (tester or system) to extract the time-zero margin map of the data-paths in a certain unit.

The fingerprint may be analyzed at a time of initial operation and monitored over the life of the IC to determine when a predicted failure may occur. For example, a defect degradation gradient analysis may determine the future time of a failure of the IC. For example, analyzing the minimum margin of a fingerprint, plotting the minimum margin over time, and extrapolating the plot to a margin delay of zero determines the predicted time of failure.

Figure 3:
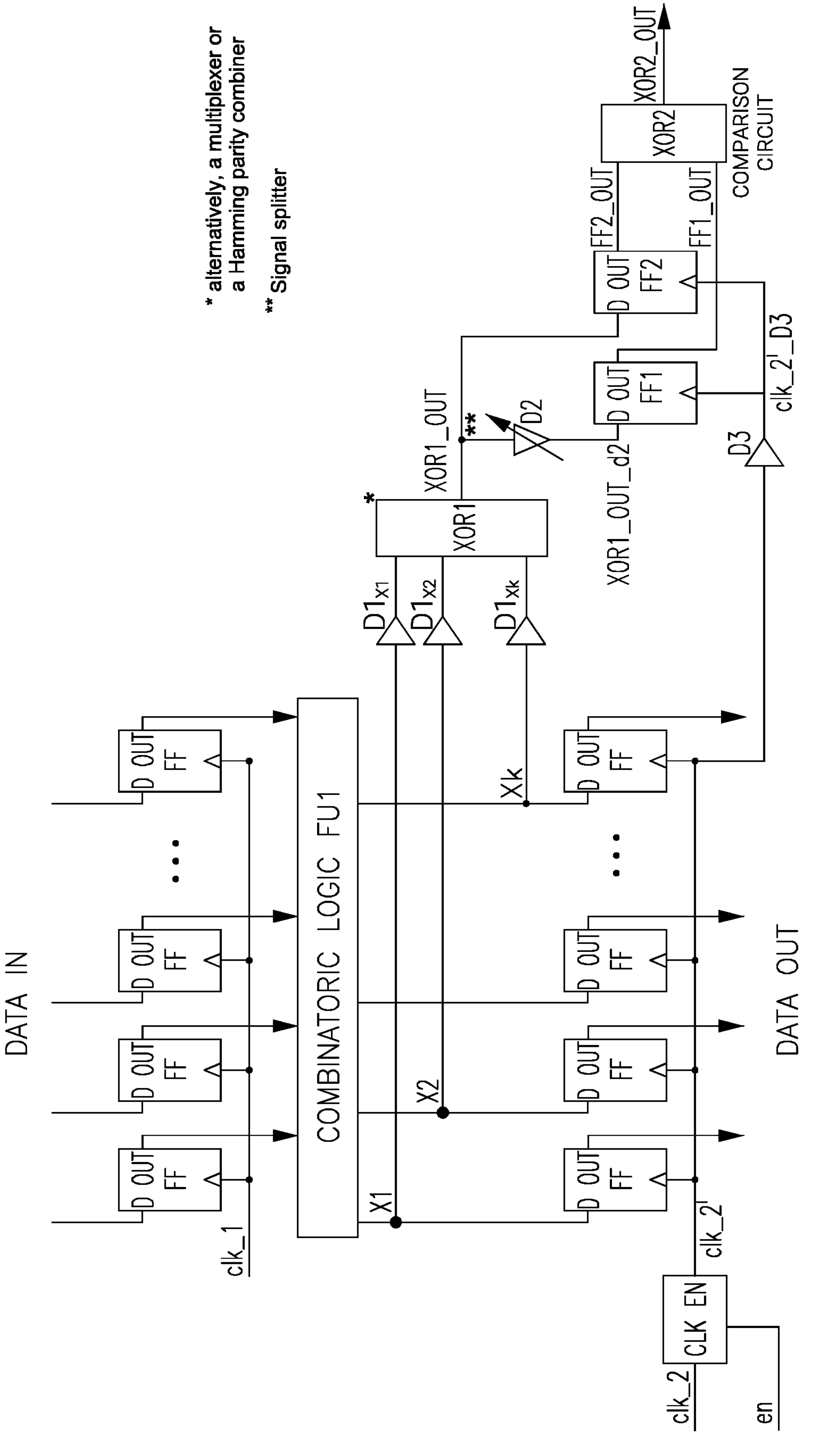
FIG. 3, FIG. 3A and FIG. 3B show respective XOR-based circuit diagrams for IC margin measurement and failure prediction.

Reference is now made to FIG. 3, which shows a XOR-based circuit diagram for IC failure prediction. In effect, a possible structure of a MFPC (as shown in FIG. 1) is depicted. An XOR component (XOR1) combines the signals from a data-path, such as 64, 128, 256, 512, or the like number of signals into a single signal XOR1_out. XOR1_out is split between two test paths. The first test path is fed into a first flip-flop FF2, and the second test path is fed into a delay line D2. The delayed XOR1_out is fed into a second flip-flop FF1. FF1 and FF2 are activated by a clock clk_3, and their outputs XOR combined with XOR2. XOR2_out is a logical 1 for each delay where one of XOR1_out and XOR1_out_d2 is logical 1 at time of clk_d1.

Thus, multiple instances of clk_d1 may and/or multiple values of D1 may determine timing delay data of the delay along data-paths of combinatorial (Combinatoric) logic FU1, and thus the fingerprint of timing delays. By analyzing these timing delays over time, the MFPC may detect which of the paths of FU1 is degrading and/or aging fastest, and may cause failure of IC 150.

The output signal of XOR1 may be considered a compression of the input signals that preserves the minimum timing margin delays of the input signals of the data-path. The output of XOR2 may be logic-1 (fail condition or timing violation) when the minimum margin of an input signal is smaller than the delay associated with D2. Conversely, the output of XOR2 may be logic-0 (pass condition) when the minimum margin of an input signal is at least the delay associated with D2. Thus, XOR1 may be a parity checker, i.e. the output is logical 1 when the parity of the input signals is logical 1. Each rising-edge of the compressed signal (XOR1 output) may be associated with a rising edge of one of the input signals. For the simple case in which the minimal timing delay margin is associated with only one input, the last rising or falling transitions of XOR1-output represents the minimal margin. This concept may be proven by a mathematical proof, described in PCT International Publication No. WO2019/097516, as well as by event-based simulations. For example, special cases may be proved by simulation, where the margin of several signals is smaller than D2, multiple signals switched simultaneously, and/or the like.

In the general terms considered above, the IC may further comprise: a first internal storage circuit, electronically connected to the signal path combiner output and arranged to provide the stored signal path combiner output as a first input to the comparison circuit; and a second internal storage circuit, electronically connected to the delayed signal and arranged to provide the delayed signal as a second input to the comparison circuit. However, such a configuration is optional, as will now be discussed.

Figure 3A:
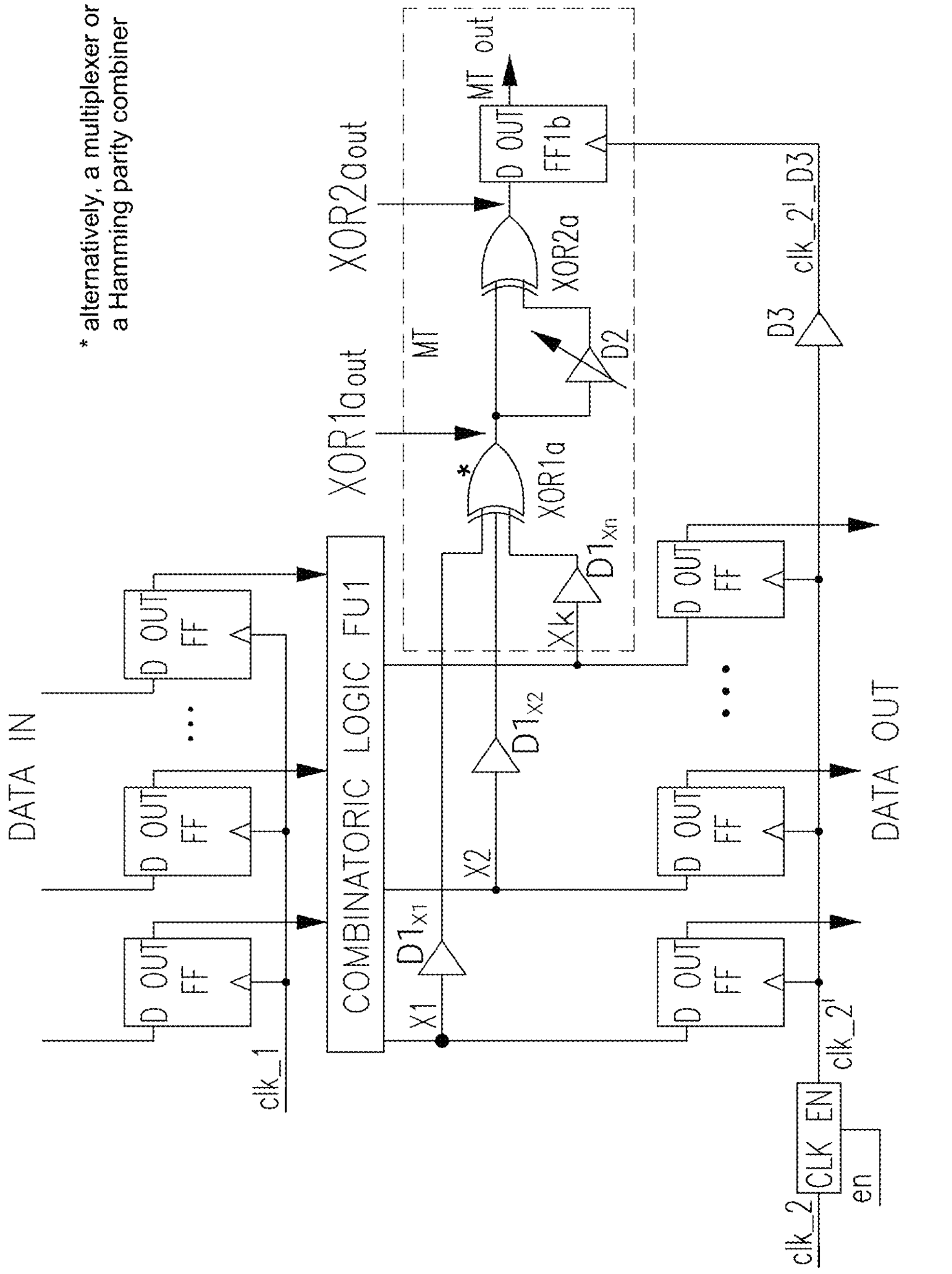

Reference is now made to FIG. 3A, which shows a different version of a XOR-based circuit diagram for IC failure prediction (that is, another possible structure of a MFPC), in comparison with that shown in FIG. 3. The data-path shown in FIG. 3A has essentially the same structure as that shown in FIG. 3. In this version, a XOR component XOR1a combines the signals from the data-path, such as 64, 128, 256, 512, or the like number of signals, into a single output signal, $XOR1a_{out}$. $XOR1a_{out}$ is split between two test paths, with the first test path fed as a first a first input to a second XOR circuit XOR2a and in parallel, the second test path fed to a delay-line D2, the output of which provides a second input to the second XOR circuit XOR2a. The delayed output signal from the second XOR circuit XOR2a, $XOR2a_{out}$, is fed into a flip-flop FF1a. Flip-flop FF1a is activated by a clock (clk1a). The second output signal $XOR2a_{out}$ is a logical 1 for each delay where the two inputs of the second XOR circuit XOR2a are at different logic state at time of clk1a.

Figure 3B:
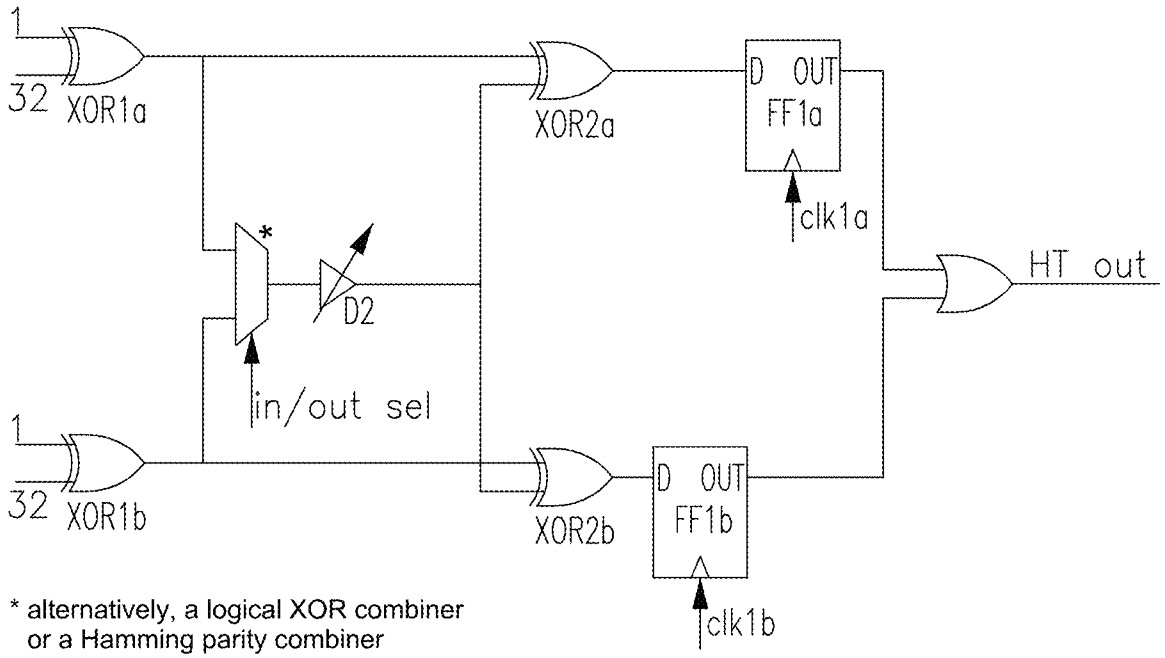

Reference now is made to FIG. 3B, which shows a further different version of a XOR-based circuit diagram for IC failure prediction, in comparison with that shown in FIG. 3. In this version, two XOR-based failure prediction circuits are provided that use one delay-line circuit. In other words, two data-paths are provided, each of which may be in accordance with that shown in FIG. 3 or FIG. 3A. The first failure prediction circuit comprises: a first XOR component XOR1a that is driven by a set of parallel-input signals from a first data-path (as discussed with reference to FIG. 3 or FIG. 3A above); a first signal splitter (circuit node), splitting the output of the first XOR component XOR1a between two test paths; a second XOR component XOR2a having one input coupled to one of the test paths; and a first flip-flop FF1a that is clocked by a first clock signal clk1a. The second failure prediction circuit comprises: a third XOR component XOR1b that is driven by a set of parallel-input signals from a second data-path (as discussed with reference to FIG. 3 or FIG. 3A above); a second signal splitter (circuit node), splitting the output of the third XOR component XOR1b between two test paths; a fourth XOR component XOR2b having one input coupled to one of the test paths; and a second flip-flop FF1b that is clocked by a second clock signal clk1b. A common delay-line D2 serves the two failure prediction circuits with a multiplexer MUX selecting, in a time-sharing mode, whether the output of the first XOR component XOR1a or the output of the third XOR component XOR1b is provided as an input to the common delay-line D2. This is controlled using a selection signal In/out sel. The configuration of each of the two failure prediction circuits is otherwise as shown in FIG. 3A. The output of the first flip-flop FF1a clocked by first clock signal clk1a and the output of the second flip-flop FF1b clocked by second clock signal clk1b are provided as inputs to an OR gate to generate an output signal HT-out. When the multiplexer MUX connects the output of the first XOR component XOR1a to the input of the delay-line D2, output signal HT-out is a logical 1 for each delay where the two inputs of the second XOR component XOR2a are at different logic state at time of the first clock signal clk1a. When the multiplexer MUX connects the output of the third XOR component XOR1b to the input of the delay-line D2, output signal HT-out is a logical 1 for each delay where the two inputs of the fourth XOR component XOR2b are at different logic state at time of second clock signal clk1b.

In general terms, it may be further considered that the signal path combiner is a first signal path combiner arranged to receive a plurality of signals from a first data source (which may be a data-path or other set of signals as discussed herein) and the comparison circuit is a first comparison circuit. Then, the IC may be considered to further comprise a second signal path combiner, comprising a plurality of input paths and an output, the second signal path combiner output being based on a combination of respective signals received on each of the input paths, the signals being received from a second data source. Then, a multiplexer may be provided, configured to receive the first signal path combiner output, the second signal path combiner output and to selectively output the first signal path combiner output or the second signal path combiner output based on a received selection signal. The output of the multiplexer may be provided as the input to the delay circuit (such that the delay circuit is common to both the first and second signal path combiners. The IC may further comprise a second comparison circuit arranged to provide a second comparison output based on a comparison of the second signal path combiner output and the delayed signal (which may thereby be common to both the first and second comparison circuits). An OR gate may further be arranged to receive as inputs the first comparison output and the second comparison output and to provide an output as the comparison data signal to the at least one mitigation circuit. With reference to the method aspect, this may further comprise: combining respective signals received on each of a plurality of input paths at a second signal path combiner to provide an output, the signals being received from a second data source; receiving the first signal path combiner output, the second signal path combiner output and a selection signal at a multiplexer and selectively outputting the first signal path combiner output or the second signal path combiner output based on the selection signal, the output of the multiplexer being provided as the input to the delay circuit such that the step of delaying comprises delaying the first signal path combiner output or the second signal path combiner output by the variable delay time at the delay circuit to output the delayed signal; comparing the second signal path combiner output and the delayed signal to provide a second comparison output; and receiving at an OR gate, the first comparison output and the second comparison output as inputs and outputting the comparison data signal as an output from the OR gate to the at least one mitigation circuit.

Optionally, a first comparison storage circuit, controlled by a first clock signal, may be arranged to receive the first comparison output. Then, a second comparison storage circuit, controlled by a second clock signal (which may be the same or different from the first clock signal) may be arranged to receive the second comparison output. The first comparison storage circuit is advantageously arranged to provide the first comparison output as a first input to the OR gate and the second comparison storage circuit is arranged to provide the second comparison output as a second input to the OR gate.

Figure 4:
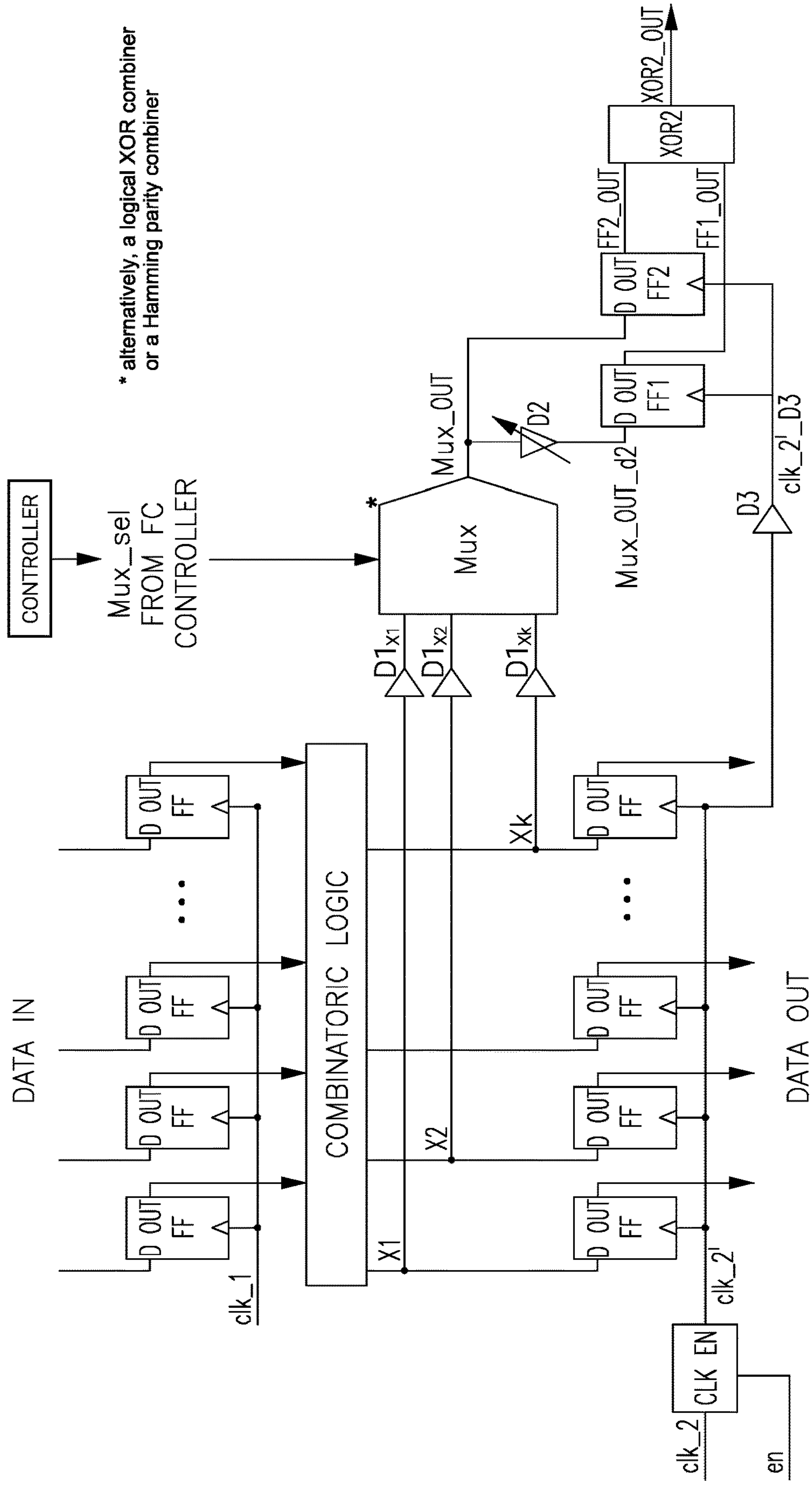
FIG. 4 shows a MUX-based circuit diagram for IC margin measurement and failure prediction.

Reference is now made to FIG. 4, which shows a MUX-based circuit diagram for IC failure prediction. A multiplexer (Mux_sel) is used to select one or more of the data-paths, and then detect a delay timing fingerprint as described herein. The advantage with the MUX-based MFPC is that the one signal is selected for delay timing at a time, so failure may be detected with less data (such as with a dedicated analysis circuit on the IC). Optionally, a hybrid MUX/XOR based MFPC may be used that combine some of the advantages from each type of MFPC.

Optionally, the circuits shown in FIGS. 3, 3A, and 4 share the following clocking characteristics: clk_1 and clk_2 are clock signals originating from the same source, such as the clock signal generator of the pertinent IC. clk_1 may be referred to as a "launch clock signal," as it facilitates the launching of data into the signal path (the combinatoric logic shown between the "data in" and "data out" labels). clk_2, in turn, may be referred to as a "capture clock signal," as it facilitates the capture of data by the flip-flops that terminate the data path-those shown immediately above the "data out" label.

clk_2 may be gated by a clock enable switch (CLK EN), which enables and disables the propagation of the clk_2 signal towards the terminating flip flops (where that clock signal is labeled clk_2' to enhance clarity) respective of an enable signal (en); for instance, when the enable signal is high-propagation of clk_2 is enabled, and vice versa.

D3 may be a buffer (or any other electronic component, or a plurality of such components, that causes a signal delay) configured to introduce an amount of delay to clk_2' that compensates for the intrinsic delay caused by D1 (further discussed below) and the signal path combiner (for example, the XOR tree combiner shown in FIGS. 3 and 3A, or the multiplexer-type combiner shown in FIG. 4). Namely, D1 and the signal path combiner, by their mere existence, cause a certain delay to the data signals propagating through them (typically, in the range of a few up to a few dozen picoseconds), and D3 therefore delays the corresponding clock signal by the same amount. The clk_2' signal, after having been delayed by D3, is shown in the figures as clk_2'_D3.

D1, in turn, may refer to a series of buffers ($D1_{X1}, \ldots, D1_{Xk}$), respective of the number of paths ($X_k$) that enter the signal path combiner, configured to reduce the load on the inputs of the terminating flip-flops, caused by the connection of the these inputs to the signal path combiner. That is, without the D1 buffers, the branching of the paths $X_1, \ldots, X_k$ towards the signal path combiner would have overloaded the flip-flop inputs, thereby affecting (and possibly damaging) the data signals that are to be monitored.

Figure 5:
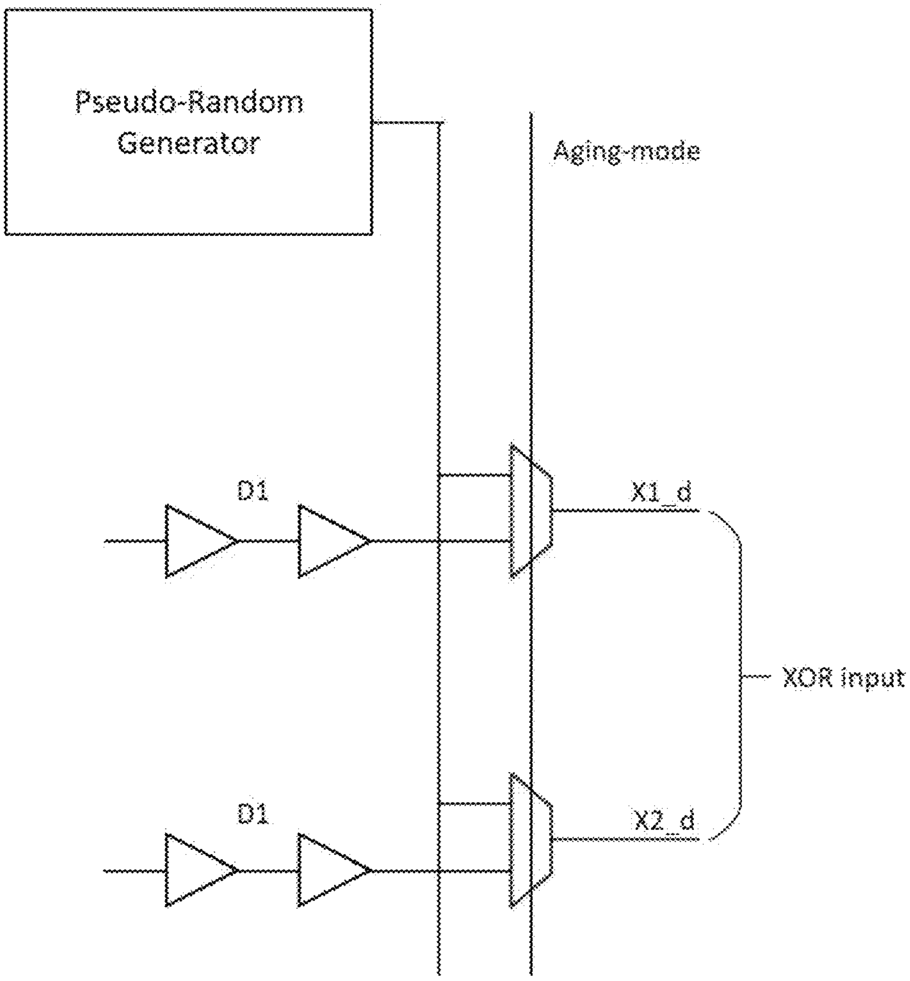
FIG. 5 shows a circuit diagram for anti-IC aging mode.

Reference is now made to FIG. 5, which shows a circuit diagram for anti-IC aging mode. The figure shows an anti-aging technique that deactivates the XOR circuit when the MFPC circuit is not enabled i.e. the MFPC clock is gated. When the circuit is disabled, a constant logic delay will increase the circuit degradation, such as due to NBTI effects. To mitigate the NBTI degradation the XOR circuit is toggled whenever the MFPC clock is gated. Alternatively, each of the signals is monitored separately for margin degradation. FIG. 5 is just one example of alternative embodiments of circuit corrections that may be performed to compensate for the degradation and/or aging of the IC circuit. Many other example circuits may be used.

The techniques disclosed herein may be expanded to other types of logic paths/signals, path lengths, and different types of generating and sampling electronic elements. For example, phase paths, latch-based logic paths, gated-clock logic paths, flip-flop (FF) fall timing logic signals, and/or the like. For example, embodiments may detect hold-failure (min-delay) that is caused by a delay degradation in the clock path. In this example, a new delay-path (such as D4) is located between the clock of FF1 and FF2 such that the D4 delay value delays the clock of FF2.

The MFPC may be always on or activated by an enable signal. For example, an enable signal represents a logical OR of the enable signals corresponding to the group of FFs that are sampled by the MFPC. When the enable is low, the MFPC may enter into an anti-IC aging mode detection, where a dedicated clock is used to toggle the MFPC to mitigate NBTI aging effects.

When the MFPC covers large logic areas (FUs) of the IC, the MFPC may be used as a timing delay margin signature or fingerprint of the IC at first operation. Over time, the MFPC may measure the margin signature at different times to analyze and detect the time gradient of the IC degradation/aging. Different gradient functions may be related to different types of defects and degradation modes.

Optionally, the signature comprises multiple, overlapping delay margins, and a several critical timing delay margins are identified as having different time gradients each, and each is separately analyzed to predict a future IC failure. For example, non-linear, spatiotemporal correlation methods are used to track multiple timing delay margins simultaneously from a series of signatures or fingerprints, each signature or fingerprint representing a one-dimensional vector of all timing delays overlapped. For example, a transformation is performed of multiple one-dimensional vectors to produce a two or more-dimensional data representation. For example, Laube et al. published in 2002, "Analyzing Relative Motion within Groups of Trackable Moving Point Objects", in Lecture Notes in Computer Science (Egenhofer et al.—editors—Geographic Information Science, GIScience 2002), vol. 2478 (Springer, Berlin, Heidelberg), pages 132-144.

When the performance of semiconductor integrated circuits is degraded over time, the progression of physical defects may gradually increase the delay time of the IC's circuits. The IC may fail when the delay time exceeds the IC's clock cycle time. Existing defect detection techniques may be able to detect defects after failure occurs, but when eminent failure is predicted, preemptive maintenance may be performed. This is especially important to applications where cost of failure is high (such as autonomous vehicles), cost of replacement is high (such as satellite IC failure), cost of failure to product image is high (such as a resulting negative user experience is created by failure), and/or the like. An integrated circuit (IC) embodiment using the techniques disclosed herein, includes a failure prediction circuit and a system that may alert of an imminent failure before the failure occurs.

For example, in the generalized sense discussed above, the variable delay time may be set in an integer multiple of increments equal to a clock period of the IC divided by a factor (a "signature vector size"), which may be from 1 to 100,000.

In some embodiments, the failure prediction circuit is comprised of a pair of storage components (e.g., flip-flops) that both receive a data signal output from a large number of paths of the IC, such as a data-path, memory paths, logic paths, and/or the like. To reduce overhead, the data signal is reduced using Hamming codes, parity codes, other error-correction techniques, and/or the like, before being stored in the two storage components. The two storage components differ from each other in data signal input timings, clock signal input timings, phase of input signals, input logic thresholds of the data signal, and/or the like. For example, a variable timing circuit is used to delay the signal to one of the flip-flops.

The FPC or MFPC further includes electronic components that determine (a) coincidence or non-coincidence of the outputs from the two storage components, and (b) how close the delay between non-coinciding outputs is to the clock cycle time of the IC.

In operation, after the coincidence or non-coincidence of the signal outputs is determined (such as using an XOR component), the failure prediction circuit increments the input timing, clock signal input timing, or input logic thresholds of one of the storage components, and the coincidence or non-coincidence of the outputs is determined again. This cycle may be repeated with small increments.

A log is maintained of the relative length of the sensed delay in comparison to the clock cycle time, as well as of the storage components increment used. Analysis, such as trend detection, combinatorial analysis, machine learning, regression analysis, anomaly detection, and/or the like, may be performed on the logged data, to estimate when the ICs degradation may reach a time when the IC fails, such as when the shortest logical path delay exceeds the subsequent clock cycle time.

This measurement and/or estimation may be utilized in a number of ways. An alert may be issued to the user of the system where the IC is implemented, indicating either the margin (how close the delay is to the IC's clock cycle time) or the estimated failure time. Further, the agent may instruct an operational change of the IC, such as clock speed or voltage reduction, which may postpone the failure and prolong the IC's lifespan.

By continuously monitoring logic circuits at the data-path output using a small number of components, resources, such as IC area, power, and/or the like, may be conserved relative to existing techniques.

For example, the input signals are compressed to generate a Hamming code (compressed into the Hamming space). The Hamming-code may be used for higher-order of error detection, correction, and/or prediction process. For example, an XOR-based circuit is used to combine all data-path signals into two unified signal path that implements a modulo-4 logic operation. Other types of compression (source) code may be used additionally or as an alternative.

In the general terms discussed previously, it may be understood that the signal path combiner (or at least one of the signal path combiners) comprises at least one of a logical XOR combiner (as shown in FIG. 3 or FIG. 3A), a Hamming parity combiner, and a multiplexer.

The technique may be expanded to other types of logic-paths and sampling sequential elements, for example:

Phase paths

Latch-based logic paths

Gated-clock logic paths

Data-path signal fall based logic paths

Memories inputs & outputs

The failure prediction circuit may be always on or may be activated by an enable signal that represents a logic-OR of the signals of a data-path. When the enable is low, the failure prediction circuit uses a dedicated clock to toggle the circuit to mitigate aging effects.

Integrated circuits may implement a large number of synchronous and timing sensitive logic circuits. When the delay of the circuit is increased due to physical degradation, then a timing violation occurs, and the violation may affect the functionality of the circuit. The physical degradation may be caused by aging effects, or due to defects that developed during use. The failure prediction circuit tracks the logic delay margin over time, and may predict a failure due to physical delay degradation.

In the general terms discussed above, it may therefore be considered that the mitigation circuit is at least one circuit from the group consisting of: a notification circuit (for example, as configured to produce notification 206 or 213); a timing delay measurement (or estimation) circuit (for example, for providing a timing delay output); a data transmission circuit; an IC anti-aging compensation circuit (for instance, as discussed with reference to FIG. 5 above); and a failure analysis circuit.

Where the mitigation circuit is a data transmission circuit, it may be electronically connected to a computerized server. Then, the computerized server is advantageously configured to receive multiple instances of the comparison data signal (for example in respect of different times and/or different data sources). The computerized server may thereby perform a failure prediction analysis of the comparison data signals. Optionally, it may send a notification to a mitigation module (such as an IC anti-aging compensation circuit) when the failure prediction analysis predicts failure of the IC within a predefined time. At least some of the comparison data signals may be generated at multiple values of the variable delay time and/or at least some of the comparison data signals may be generated from multiple instances of at least one value from multiple values of the variable delay time. Optionally, the failure prediction analysis comprises at least one of a machine learning analysis, a trend analysis, a multiple object tracking analysis, and a multivariant analysis. Advantageously, the failure prediction analysis comprises receiving comparison data signals and/or failure prediction analysis results from multiple different ICs.

The failure prediction circuit beneficially continuously monitors a large number of logic circuits, such as signals of a data-path on the output of a functional unit of an IC, using small IC area and power.

In some embodiments, a computer algorithm may be used to determine the population of the failure prediction circuits within a unit per a pre-defined coverage. It may use design-data such as memory-circuits and flip-flop-circuits within the unit. The computer algorithm may also be used to automatically locate the FPC or MFPC circuits per the unit clock-gate signals and to automatically set the input-signal-size per FPC or MFPC for optimal performance (maximum instance coverage with minimum number of FPC or MFPC circuits).

In some embodiments, the delays within the failure prediction circuit may be calibrated. This may be done in order to have a very fast correlation path to the design data and to provide accurate margin results at time zero (during test). One calibration methodology may use Pre-Si estimator functions that are based on on-die sensors (agents) in Post-Si to translate the FPC or MFPC circuit measured margin in Pre-Si to the worst-case margin of the monitored endpoints (FFs) margins.

The term "worst-case" is used here to denote the narrowest (lowest) remaining margin among the multiple data paths. Because signals from the data paths are combined, it may be impossible to know the individual remaining margin of each of these data paths. Instead, the output of the margin measurement circuit may be indicative of the narrowest margin existing among the data paths. This knowledge is typically sufficient, because if even a single critical path fails due to a timing violation, the entire IC may become effectively inoperative.

In general terms, this may be considered to include measuring or estimating a timing delay for the IC (particularly at initial or time-zero operation), based on the comparison data signal provided to the mitigation circuit. The timing delay may be based on a plurality of comparison outputs (which may be in a single comparison data signal or a plurality of comparison data signals), for example determined by repeating the steps of combining, delaying and comparing for each of a plurality of delay times.

In some embodiments the delay through X1 . . . . Xn+Xor1A+Xor2A is balanced by a delay applied (by D3) to the clock used for the output flip-flop.

Figure 11:
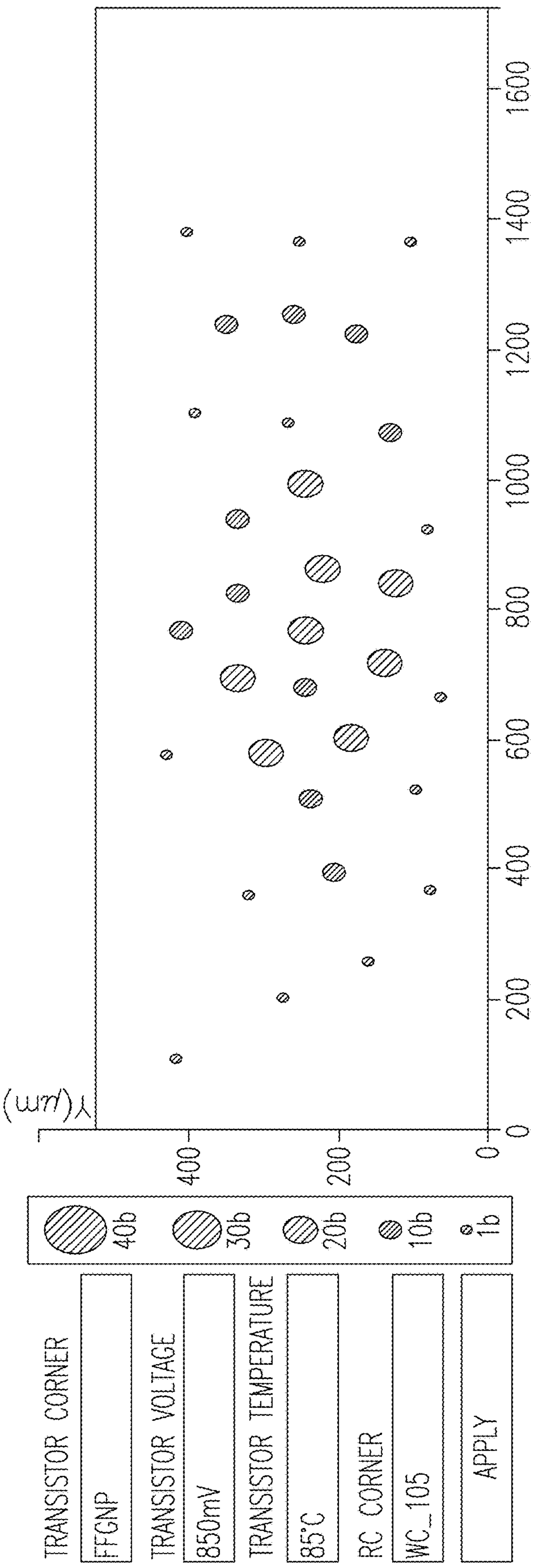
FIG. 11 shows a Margin-Map diagram of a unit.

In some embodiments, the timing margin data of a large-scale logic circuit within a unit or a die that was extracted at time-zero, such as digital logic circuits and/or the like, may be tracked and compared over time. The tracking may detect and/or predict a timing failure due to change in the delay and/or aging degradation of the IC. Referring now to FIG. 11, there is shown shows a Margin-Map diagram of a unit. This is an example of a unit margin map that represents the unit margin fingerprint at the beginning of life (the margin is represented by an equivalent buffer-delay). The signature may be used for chip outlier detection/screening. In other words, a specific IC is given a unique identity and the signature is compared to other ICs, which allows detecting anomalies in a large manufacturing scale. The margin-map can be tracked over time to measure the margin signature at different times to analyze and detect the time gradient of the IC degradation or aging. Different gradient functions may be related to different types of defects and degradation modes.

In some embodiments, the margin data of a die can be collected and used for die-classification and anomaly-detection processes. This is done by collecting the margin data of a unit within a die and use ML algorithms to build an estimator function that are based on on-die sensors. More details are described in U.S. Patent Application Publication No. 2021/0173007 entitled "INTEGRATED CIRCUIT PROFILING AND ANOMALY DETECTION", published Jun. 10, 2021.

In some embodiments, the margin data can be analyzed per a specific running application to generate an application-based frequency/power binning.

As discussed above, each MFPC is operated over multiple instances, each with a different delay (achieved by adjusting the delay-line D2, as shown in FIGS. 3-4), in order to determine a margin for the logic circuit (FU). An output of the MFPC indicates whether the margin of the data paths tested is at least that of the delay applied by delay-line D2, such that multiple instances of the MFPC operation with different delays can identify a range for the margin (based on a delay value that is below the margin, because the MFPC indicated a pass condition for that delay value, and a delay value that is above the margin, because the MFPC indicated a fail condition for that delay value). Effectively, the delay is incrementally increased (if scanning from lowest delay) in each subsequent clock cycles until a timing violation occurs (or decreased in each subsequent clock cycles until a timing violation does not occur, if scanning from highest delay).

Typically, the delay-line D2 can be adjusted to one of a group of discrete delay values, each delay value corresponding with a specific timing margin value. For example, the delay-line D2 can be configurable to apply a delay corresponding with that of a defined number of buffers, in each measurement instance. In one such implementation, the delay-line D2 comprises 32 delay configurations, thereby allowing a delay of between zero buffers and 31 buffers to be set. Each buffer may correspond with a delay of a fixed amount, for instance 0.01 ns. Thus, operation of the MFPC can be used to indicate that a margin for the FU is between two integer number of buffers (a so-called 'bin' for the timing margin, equivalent to a one-buffer delay resolution). The delay provided by the buffers may be a different amount, for example any one of: 0.005 ns; 0.01 ns; 0.02 ns; 0.025 ns; 0.03 ns; 0.04 ns; 0.05 ns; 0.06 ns; 0.07 ns; 0.075 ns; 0.08 ns; 0.09 ns; or 0.1 ns. Other numbers of delay configurations and/or buffers are possible, for instance 2, 4, 8, 16, 64, 128, 256 or more. Optionally, the interval between delays provided by subsequent buffer and/or delay configurations may differ.

In the example discussed herein, the initial delay value (zero buffers) may be approximately 0.01 ns, which is then increased in increments of approximately 0.01 ns with every instance. Each instance typically lasts multiple clock cycles and the number of clock cycles per instance is normally the same (this may apply more generally and not just to this example). In this example, the fourth incremental increase will bring the artificial delay to approximately 0.05 ns, and, assuming that the (yet unknown) margin is indeed 0.05 ns, the data signal will not successfully propagate in the respective instance. This failure to propagate (timing violation) is then detected, and the margin of that data path can be determined to be between approximately 0.04 ns and approximately 0.05 ns in this example.

This sequence of gradually incrementing the artificial delay may be periodically repeated during the lifetime of the IC. A binary search is also possible. Every time the artificial delay causes a timing violation, the sequence may restart from the shortest artificial delay (for example, 0.01 ns).

In such an implementation, each delay configuration (from 1 to 32) may be used for the same number of clock cycles (that is, the delay configurations are uniformly distributed over time). As an example, each delay configuration could be used for 128 clock cycles. Thus, the number of clock cycles needed to complete measurement across all possible delay configurations is 32×128=4096 clock cycles. Then, this sequence may be repeated in subsequent clock cycles. It is noted that, taking this approach, there is an equal probability to detect an accurate range for the timing margin, whether it is 1 buffer, or 30 buffers. The detection resolution is uniform and equals one buffer.

One concern with such a margin measuring technique is that it may have poor sensitivity to rare events (particularly when the number of clock cycles for the search is low, for example during a device test). For example, a certain series of logic elements in the IC, which leads to a monitored data path, may only be rarely utilized (for instance, by operations performed rarely on the system incorporating the IC). If the path formed by that certain series happens to have a dangerously low margin (for instance, 0.01 ns), but is only used to carry a data signal once every tens of thousands or hundreds of thousands of clock cycles, the chances of that margin being measured using a margin measurement sequence based on the above approach (with an equal probability to detect an accurate range for the timing margin) may be too low. That is, the number of clock cycles in which the delay of 0.01 ns is used for margin measurement is relatively low. This is because the sequence dictates that all artificial delay values (for instance, 0.01 ns, 0.02 ns, 0.03 ns, etc.) are uniformly checked.

It is true that the chances of identifying a rare event in this way increase when the abovementioned measurement sequence is repeated many times. However, it may be a waste of resources (power, in particular, but also cost) to spend so much time, in terms of clock cycles, measuring every delay value. Statistically, a large number of clock cycles will be required to identify ("capture") a dangerously low margin under such measurement sequence.

Figure 12:
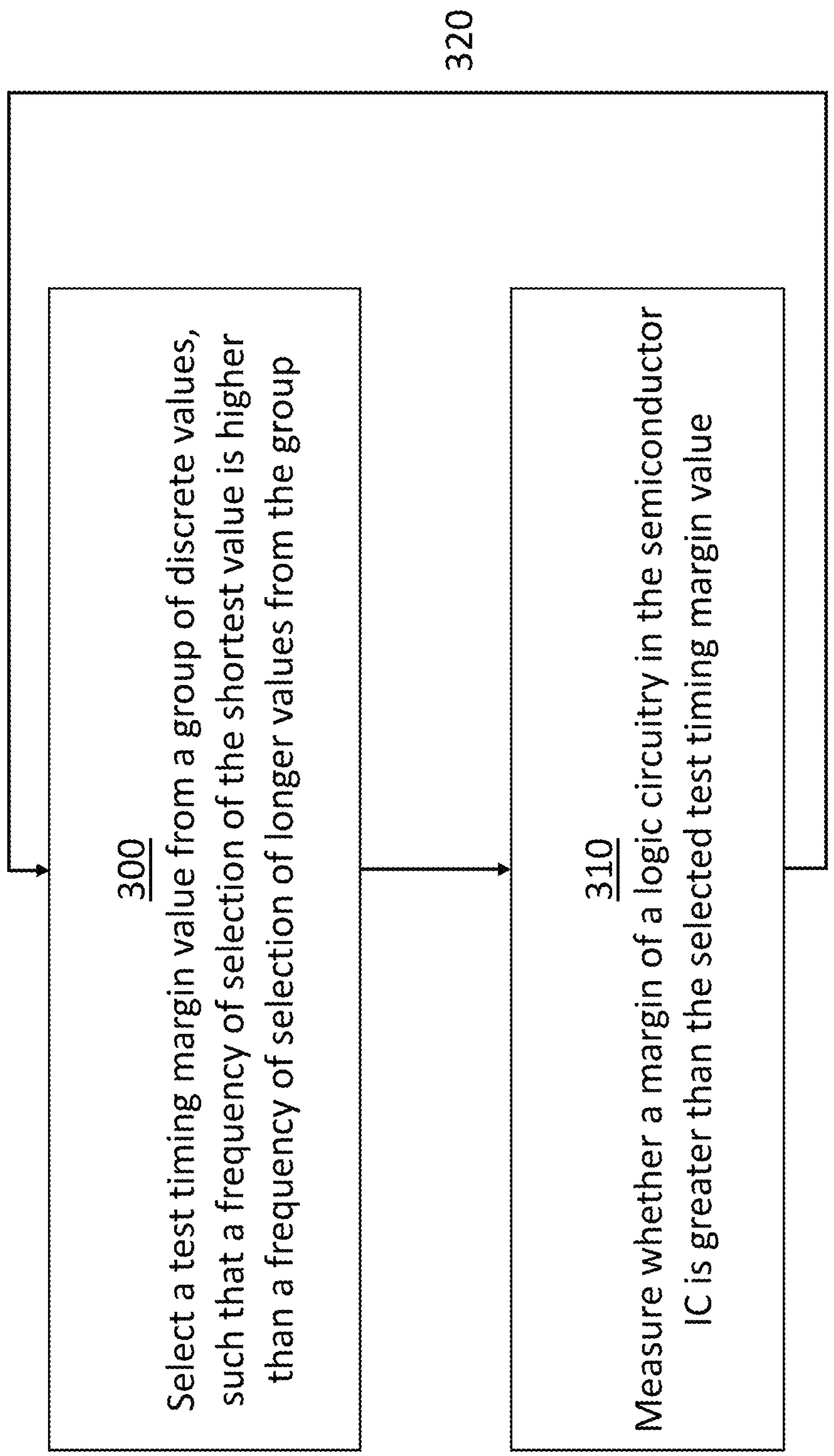
FIG. 12 shows a flowchart of a process for repeated margin measurements in an optimized way.

Referring to FIG. 12, there is shown a flowchart of a process for repeated margin measurements in a more optimized way. In a first step 300, a test timing margin value is selected from a group of discrete values. For instance, the group of discrete values may comprise the 32 configurations of the delay line, as discussed above. This is performed, such that a frequency of selection of the one or more shorter values (particularly the shortest value) is higher than a frequency of selection of one, more or all longer values from the group. The total time spent for margin measurements overall may be the same as that spent conducting a less optimized search, as discussed above. Ways in which such a selection outcome may be achieved are discussed below.

In a second step 320, it is measured (in particular, using a MFPC as herein disclosed) whether a margin of a logic circuitry in the semiconductor IC is greater than the selected test timing margin value (applied as the delay). In other words, it is determined whether a pass condition or fail condition applies to that logic circuitry (which will typically be in respect of multiple combined data paths) for the specific timing margin value being tested at that time. The specific timing margin value is that selected in the first step 300. As a result, there is more measurement of shorter test timing margin value than longer ones.

The approach of FIG. 12 (particularly the first step 300) therefore improves upon the previous way of measuring the margin of a data path, as discussed above. In this previous approach, the same length of time (the same number of clock cycles) is used for testing each delay value of the delay values that are possible for the MFPC (for example, 0.01 ns, 0.02 ns, 0.03 ns, etc.). Instead, according to the approach now described, the measurement of shorter margins (corresponding with shorter delay values) is done for a longer time duration (more clock cycles) than the measurement of longer margins (corresponding with longer delay values). In this way, the chances of measuring a dangerously low margin are increased, in particular when a rare event happens.

Advantageously, this approach can be used for margin measurement within a limited (predetermined) number of clock cycles, for example during a device test. When the device is tested within a limited number of clock cycles, the optimized search according to FIG. 12 (for example) may have a significant impact, since failure to detect a case where the lowest margin is a rare event may be problematic for subsequent use of the device. The test length is typically not related to the worst case margin search criteria and, due to limited testing resource (especially cost), test length is generally optimized to the shortest possible. An optimized search technique therefore increases the chances of detecting a low worst case margin as a rare event.

For simplicity, examples will now be considered based on the approach discussed above, in which the delay line D2 can take one of 32 configurations, with the shortest delay corresponding with one buffer (say, 0.01 ns delay) and each other configuration representing an additional buffer, from two buffers (corresponding with 0.02 ns) to 32 buffers (0.32 ns). In one such example, the time spent with the MFPC measuring with a two-buffer delay applied may be half as much as the time spent with the MFPC measuring with a one buffer delay applied (conversely, the frequency at which the two-buffer delay is applied may be half that at which the one buffer delay is applied). Then, the time spent with the MFPC measuring with a four-buffer delay applied may be half as much as the time spent with the MFPC measuring with a two-buffer delay applied, and so on (that is, each doubling of buffer delay results in a halving of the total measurement time spent). This is only an example, with this approach being applicable to any group of possible timing margin margins sequence of artificial delay incrementation in which shorter lengths (lower values) of delay are introduced more times than longer lengths (higher values) of delay.

Optionally, the more optimized search may use a reduced number of configurations for timing margin determination (that is, for the delay line). For example, rather than 32 possible configurations, only 6 configurations may be used: one buffer (which can measure a margin of between zero and one buffer in length); two buffers (which can measure a margin of between one and two buffers in length); 4 buffers (which can measure a margin of between two and four buffers in length); 8 buffers (which can measure a margin of between four and eight buffers in length); 16 buffers (which can measure a margin of between eight and sixteen buffers in length); and 32 buffers (which can measure a margin of between sixteen and thirty-two buffers in length). In this example, each configuration uses a timing margin value (delay line length) in a doubling sequence, but other possibilities can be considered.

As discussed above, a frequency of selection of the shortest timing margin value (in this case, one buffer) is higher than a frequency of selection of each longer timing margin value. The number of cycles for each configuration may therefore be reduced as the length of the timing margin value increases. For instance, the one buffer configuration may be used for 2048 clock cycles, the two-buffer configuration may be used for 1024 clock cycles, the 4-buffer configuration may be used for 512 clock cycles, the 8 buffer configuration may be used for 256 clock cycles, the 16 buffer configuration may be used for 128 clock cycles and the 32 buffer configuration may be used for 64 clock cycles. In this approach, the total number of clock cycles needed to complete measurements of all possible delay configurations is 4096 (which is the same as the uniform example given above). In other words, the ratio of the number of clock cycles (frequency of selection) of the shortest timing margin value to the frequency of selection of each longer timing margin value is inversely proportional to the ratio of the shortest timing margin value to the longer timing margin value. Again, this sequence (in which each margin value is repeated for a certain number of clock cycles, corresponding with a defined number of measurement instances) may be repeated in subsequent clock cycles. In this approach, there is therefore a 32 times greater probability of detecting a margin of up to one buffer in length compared with the uniform example.

In this way, more of the allocated time (which is typically the same as the time spent using any other search approach) is spent measuring for dangerously low margins than higher and less dangerous margins. Thus, for any given duration of time (X time, comprised of Y clock cycles), the chances of the sequence of measurements according this improved approach capturing a data path with a dangerously low margin are much greater than in the previous approach (for the same total searching time).

Figure 13A:
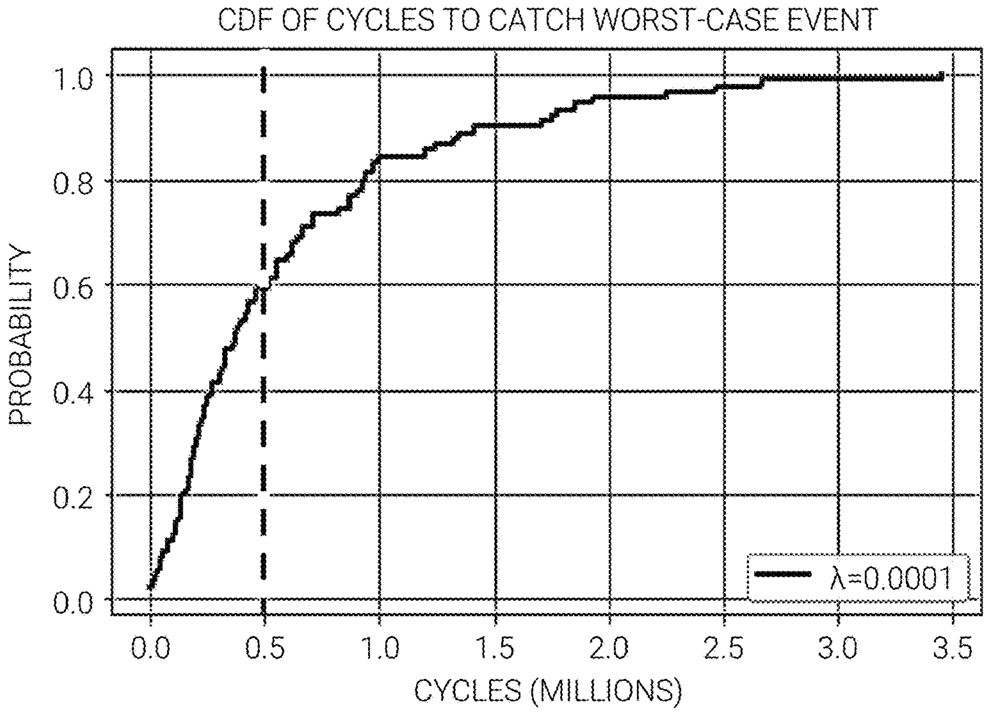
FIG. 13A shows a cumulative distribution function of probability of detecting a 1-buffer length margin according to one approach for setting a test margin value for each IC margin measurement.

Referring now to FIG. 13A, there is shown a cumulative distribution function of probability of detecting a 1-buffer length worst-case margin. This uses the previous, uniform approach for setting a test margin value for each IC margin measurement discussed above. It can be seen that a 95% probability of detecting a one buffer worst-case margin occurs at a time interval equal to 2,500,000 clock cycles.

Figure 13B:
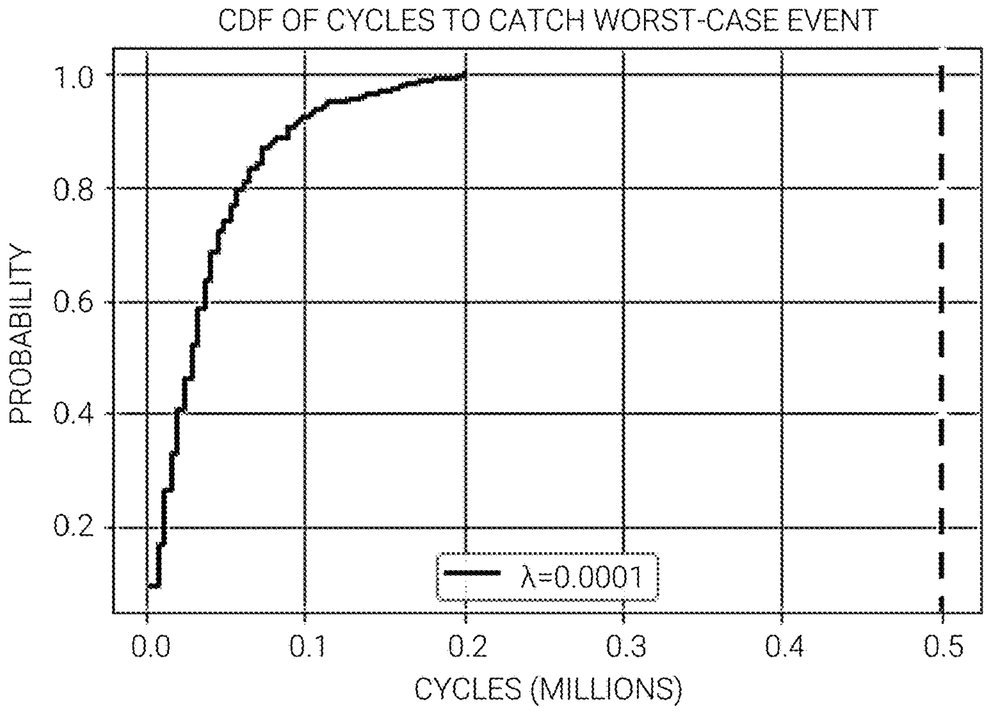
FIG. 13B shows a cumulative distribution function of probability of detecting a margin of no more than 1-buffer length using an improved, optimized approach for setting a test margin value for each IC margin measurement.
Figure 14A:
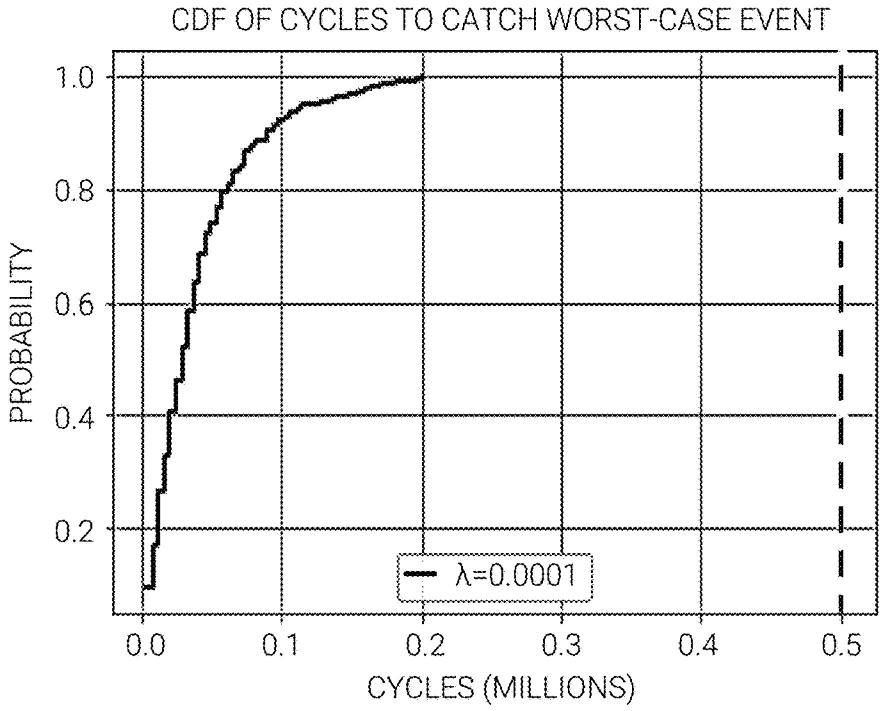
FIGS. 14A-D show cumulative distribution function of probability of detecting a margin using an approach for setting a test margin value for each IC margin measurement according to the improved, optimized approach, wherein the margin length is no more than 1 buffer (A), 2 buffers (B), 4 buffers (C) and 8 buffers (D).
Figure 14B:
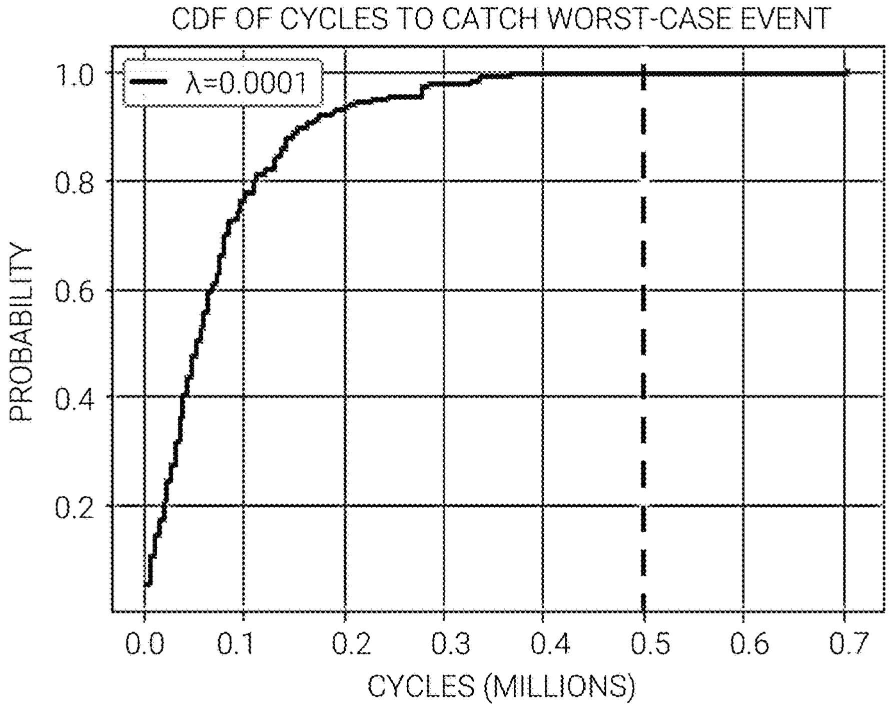
Figure 14C:
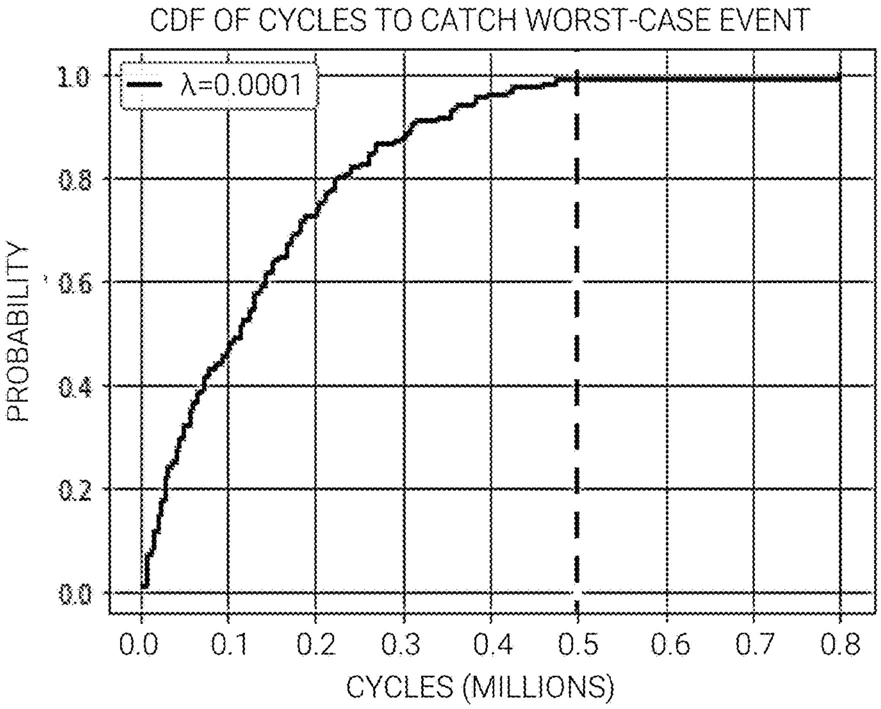
Figure 14D:
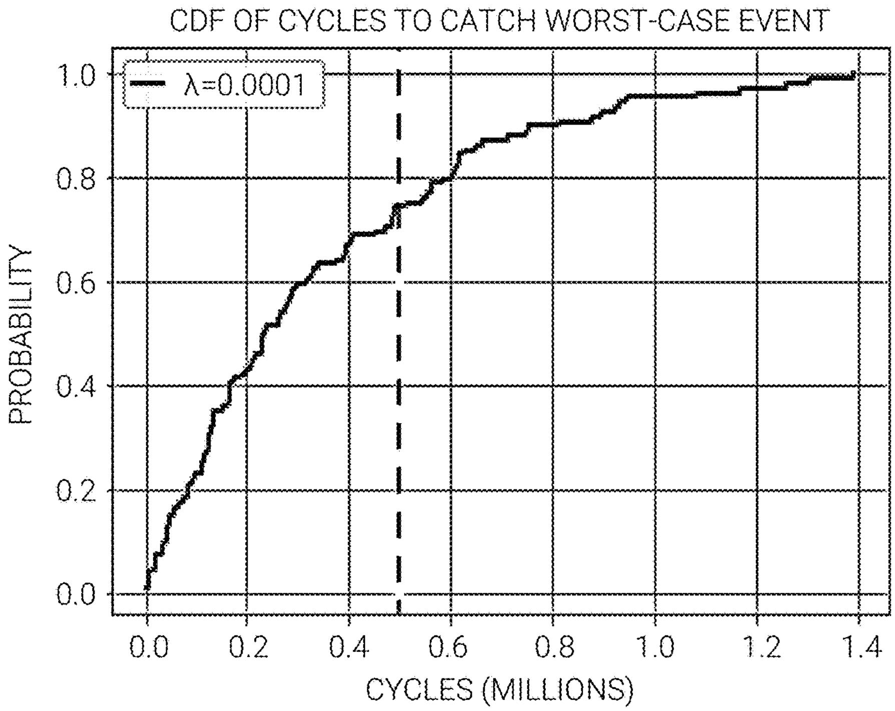

Referring next to FIG. 13B, there is shown a cumulative distribution function of probability of detecting a margin of no more than 1-buffer length using an approach for setting a test margin value for each IC margin measurement according to the improved approach discussed above. It can be seen here that a 99.999% probability of detecting a one buffer worst-case margin occurs at a time interval equal to 200,000 clock cycles. This is a significant improvement on the previous, uniform approach, as shown in FIG. 13A, in which the probability to detect a rare event within 500,000 clock cycles (which represents a typical test length) is 0.6. For enhanced visual comparison of FIGS. 13A-13B and 14A-14D, a dashed vertical line is shown in each of these figures at the 500,000 clock cycles mark.

This approach also shows benefits for detecting a worst-case margin that is longer than one buffer in duration. Referring to FIGS. 14A-D, there are shown cumulative distribution function of probability of detecting a margin using an approach for setting a test margin value for each IC margin measurement according to the improved approach, wherein the margin length is no more than 1 buffer (A), 2 buffers (B), 4 buffers (C) and 8 buffers (D). It can be seen that a 99.9% probability of detecting a worst-case margin of up to 4 buffers in length occurs within a time interval equal to 500,000 clock cycles. Even detecting a worst-case margin of up to 8 buffers in length is achieved quicker than the previous, uniform approach.

Advantageously, this approach requires no predetermined knowledge of the length of the worst-case margin. It is simply based on the recognition that smaller margins are typically: more critical to detect; and more important to detect at high resolution. This approach therefore provides significant benefits. Where there are multiple MFPCs in the IC, each MFPC may optionally operate at the same time, using the same timing margin value. As discussed elsewhere herein, the operation of the MFPC may be set up using a controller on the IC (or hard coded into the MFPC) and/or an interface external the IC, such as a computer (as shown in FIG. 1).

Although this approach is especially well-suited to use with MFPCs of the type discussed above, it may be applied to other types of failure risk measurement based on comparison of data path signals with a timing margin value. In the approach discussed above, a frequency of selection of each timing margin value is set by use of a predetermined sequence of measurements, but the same result could alternatively be achieved by randomly selecting a margin value for each measurement, with the probabilities of each timing margin value being set to match the desired frequencies.

It will be understood that, in a simplest approach, there may be only two configurations for the delay-line (that is, two options for timing margin measurement), but more than two configurations will more commonly be used. In the more optimized approach discussed above, the frequency of selection of the shortest timing margin value (one buffer) is at least (in fact, greater than) a sum of frequencies of selection of each of the other (longer) timing margin values, but this need not be the case and other options are possible. Similarly, although the more optimized approach described above has every shorter timing margin value tested more frequently than any longer timing margin value, but this may not strictly be necessary. Also, the inversely proportional relationship of frequency of selection to timing margin value duration can be changed.

Optionally, a frequency of the clock and/or a voltage of the semiconductor IC may be adjusted based on the measured margin, for instance to reduce the frequency when a relatively low margin is measured (which may thereby reduce the risk of imminent failure and prolonging a lifespan of the IC) and increase the frequency at which a relatively high margin is measured (which may thereby allow the IC to perform faster without risking imminent failure). Corresponding adjustment to the voltage may be possible. This adjustment may be performed by instructing (for example, by the controller) an AVS (Automatic Voltage Scaling) mechanism and/or an Automatic Frequency Scaling mechanism (AFS) and/or a DVFS (Dynamic Voltage and Frequency Scaling) mechanism of the IC to reduce, maintain (in case no change in margin has been measured since the least measurement), or increase the frequency of the clock and/or voltage of the IC, according to the measured margin.

In a general sense (which may be combined with any other aspect disclosed herein), there may be considered a sensor and/or method for measuring a specific logic circuitry of a semiconductor Integrated Circuit (IC). This comprises splitting a signal (by a signal splitter) from the specific logic circuitry into two test paths. A delay is applied to a first of the two test paths (by a delay element), the delay being based on a predetermined timing margin that is selected from a group of discrete timing margin values. The group of discrete timing margin values comprises a shortest timing margin value and at least one longer timing margin value. The delayed first test path and a second of the two test paths are compared (by a comparison circuit). A measurement output is provided according to the comparison for an instance of measuring. The predetermined timing margin is set (by a controller) such that, over a plurality of the instances of measuring, a frequency of selection of the shortest timing margin value is higher than a frequency of selection of each of the at least one longer timing margin value.

The sensor and/or method may form part of a system for measuring a semiconductor IC. Optionally, a computer-readable encoding of a sensor for measurement in a semiconductor IC may be provided (for instance, stored on a non-transitory computer readable medium). The computer-readable encoding may be in accordance with any sensor and/or method described herein. Optional and/or advantageous features according to any such aspect may be considered.

For example, each of the plurality of instances of measuring may be completed over a same number of clock cycles of the semiconductor IC. The total number of clock cycles over all instances of measuring may be the same as for a uniform search (in which the frequency of selection of each timing margin value is the same).

The respective predetermined timing margin is advantageously selected for each measuring over successive instances of the plurality of instances from the group of discrete timing margin values according to a predetermined sequence. The predetermined sequence is beneficially defined such that the frequency of selection of the shortest timing margin value is higher than the frequency of selection of each of the at least one longer timing margin value. In embodiments, the predetermined sequence repeats each predefined number of instances.

The sensor may be located and/or measuring performed local to the specific logic circuitry.

The comparison circuit optionally comprises a logic gate configured to receive a signal from the delayed first test path and a signal from the second test path as inputs.

It may be considered that the group of discrete timing margin values comprises a shortest timing margin value and a plurality of longer timing margin values. Then, the frequency of selection of the shortest timing margin value is optionally at least a sum of frequencies of selection of each of the plurality of longer timing margin values. In embodiments, for each of the plurality of longer timing margin values, a frequency of selection of the respective timing margin value is higher than a frequency of selection of each timing margin value longer than the respective timing margin value. In other words, longer timing margin values may have lower frequencies of selection. In some embodiments, for each of the plurality of longer timing margin values, the ratio of the frequency of selection of the shortest timing margin value to the frequency of selection of the respective longer timing margin value is inversely proportional to the ratio of the shortest timing margin value to the respective longer timing margin value. In a particular example, the plurality of longer timing margin values are defined as a sequence, each longer timing margin value in the sequence being double a preceding longer timing margin value in the sequence.

Optionally, the measuring is performed on a combined data path signal comprising a combination of individual data path signals, each of the individual data path signals coming from a different part of the specific logic circuitry.

In embodiments, each instance of the measuring determines if a failure condition is met for the respective predetermined timing margin. Then, an indication of a maximum timing margin for which the failure condition is not met and/or a minimum timing margin for which the failure condition is met may be output (by the controller). This is beneficially based on the determinations for the plurality of instances of the measuring.

Signals from multiple data paths of the specific logic circuitry may be combined (by a signal path combiner, for example, forming part of the sensor). This may provide a combined signal. Then, the signal from the specific logic circuitry that is split may comprise (or be) the combined signal.

The predetermined timing margin may be set (by the controller) so as to apply varying delay to the signal passing through the first test path over different instances of the measurement. Then, a worst-case remaining margin of the multiple data paths may be determined (by the controller), based on the comparison of the first and second test paths.

As discussed above, a system for measuring logic circuitry of a semiconductor IC may be formed by multiple sensors, each being configured to measure a respective (different or distinct) specific logic circuitry. For instance, a first sensor may measure a first specific logic circuitry and a second sensor measures a second specific logic circuitry, distinct from the first specific logic circuitry.

In another sense, a system for measuring a semiconductor IC (as discussed above) may comprise: a functional circuit of the semiconductor IC, comprising logic circuitry; and a sensor on the semiconductor IC, associated with the functional circuit and configured to receive a signal from one or more data paths of the logic circuitry. The sensor may be as described herein, for instance comprising: a signal splitter, configured to split a signal from the specific logic circuitry into two test paths; a delay element, configured to receive and apply a delay to a first of the two test paths; a comparison circuit configured to compare the delayed first test path and a second of the two test paths and provide a measurement output according to the comparison for an instance of measuring. The delay is based on a predetermined timing margin selected from a group of discrete timing margin values, which are selected as discussed herein. The predetermined timing margin may be set using a controller on the semiconductor IC and/or an interface external the semiconductor IC.

According to any aspect, a timing margin of the functional circuit may be determined based on the plurality of instances of the measurement. Then, a clock of the semiconductor IC may be set based on the determined timing margin. The clock of the semiconductor IC and/or the voltage of the semiconductor IC may be set, for example, using one or more of: an Automatic Voltage Scaling (AVS) mechanism; an Automatic Frequency Scaling mechanism (AFS) and a Dynamic Voltage and Frequency Scaling (DVFS) mechanism.

EXPERIMENTAL RESULTS

Following are the results of simulation experiments.

Figure 6:
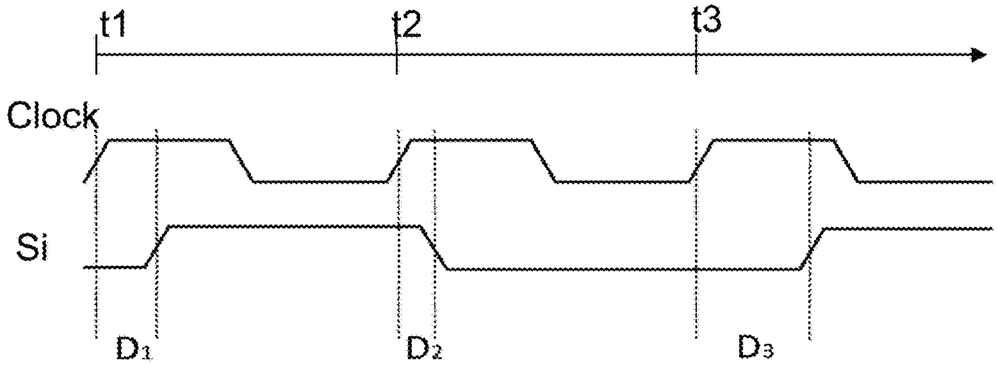
FIG. 6 shows a timing diagram of a signal delay for IC margin measurement and failure prediction.

Reference is now made to FIG. 6, which shows a timing diagram of a signal delay for IC failure prediction. Signal definition may be Di~U(Xi, Xi+di), and P{V(Si)=1, tj}=P{V(Si)=0, tj}=½. FIG. 6 shows an event-based simulation description, with simulation settings:

- XOR1 was monitoring 256 input paths
- The data length of each path was 104 clock cycles.
- The cycle time of the clock was defined as 100 units of time
- A signal Si was generated for each path [i] (detailed description in next page)
- Each path [i], was defined by two constants [Xi] and [di] which determine the delay per each clock cycle
- [Xi] was drawn for each path by a uniform distribution between 25-50 units of time
- [di] was drawn for each path by a uniform distribution between 0-25 units of time
- For signal i, the switching time in each cycle was uniformly drawn in the range of (Xi, Xi+di)
- The margin of signal i, is then [100–Xi–di]

The experiment was conducted for each value of D2, where D2 was defined in units of time, and the D2 delay value was swept in values at a resolution of needed to resolve separate timing delay margins in the signature, such as resolutions of fractions of the clock period times. For each D2 value, XOR2 output transitions may be counted, and the number of counts is plotted vs. the margin timing value threshold. The X-axis margin threshold may be 100-D2, and the Y-axis may be the number of [1]'s at the output of XOR2 observed for a certain value of D2:

$$XOR2 = 1 \text{ iff } XOR1(t = 100) \neq XOR1(t = D2).$$

Figure 7:
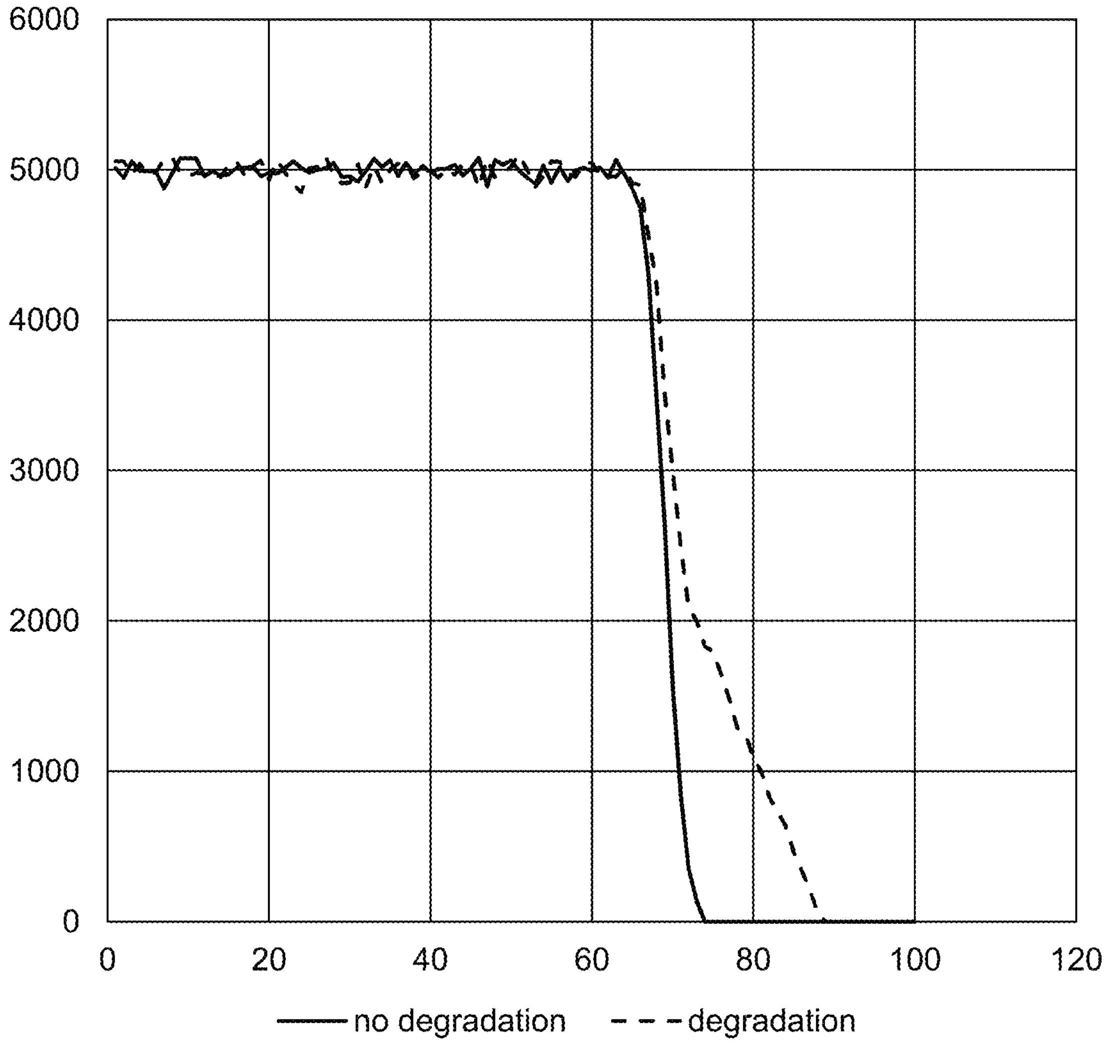
FIG. 7 shows a graph of errors versus cycle time for a first experiment.

Reference is now made to FIG. 7, which shows a graph of errors versus cycle time for a first experiment. The solid line represents the MFPC output at time-zero (without degradation), and the dashed line represents the MFPC output after degradation. The minimum margin was equal to 25 time-units, such as [100–75], and MaxD2 at failure was 75 time-units. In the degradation scenario the margin of one path was reduced by 15 time units (margin is distributed uniformly, and the max value was moved by 15 time units), the MFPC detects the change in the margin. Here the minimum margin was equal to 10 time-units, such as [100–75–15], and MaxD2 at failure was 90 time-units. The graph shows the counts at XOR2 output are gradually reduced to zero. For each D2 in the range of [75-90]:

$$P(XOR2 = 1) = P(\text{change, delay} > D2) = 0.5 * (90 - (100 - D2))/(di + 15).$$

Figure 8:
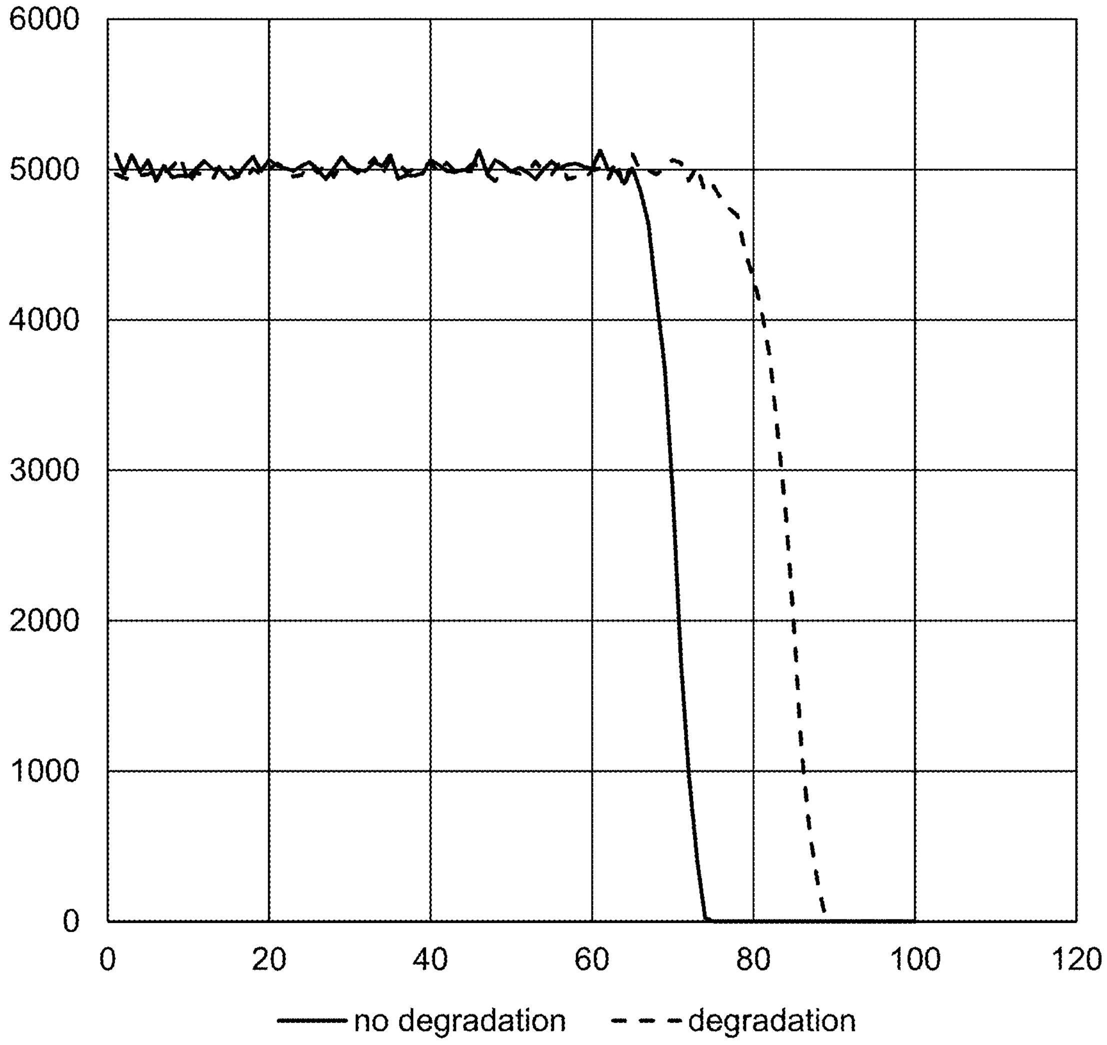
FIG. 8 shows a graph of errors versus cycle time for a second experiment.

Reference is now made to FIG. 8, which shows a graph of errors versus cycle time for a second experiment. The solid line represents the MFPC output at time-zero (no degradation), and the dashed line represent the MFPC output after degradation. The minimum margin of all the paths with [Xi+di>70] (margin<30) was increased by 15 time-units, and this was performed for 5 signal paths. The minimum margin was equal to 25 time-units, such as [100–75], and MaxD2 at failure was 75 time-units. The MFPC detects the change in the margin, where the minimum margin was equal to 10 time-units, such as [100–75–15], and MaxD2 at failure was 90 time-units. The counts at XOR2 output are gradually reduced to zero. The probability of failure was increased with the number of paths.

Figure 9:
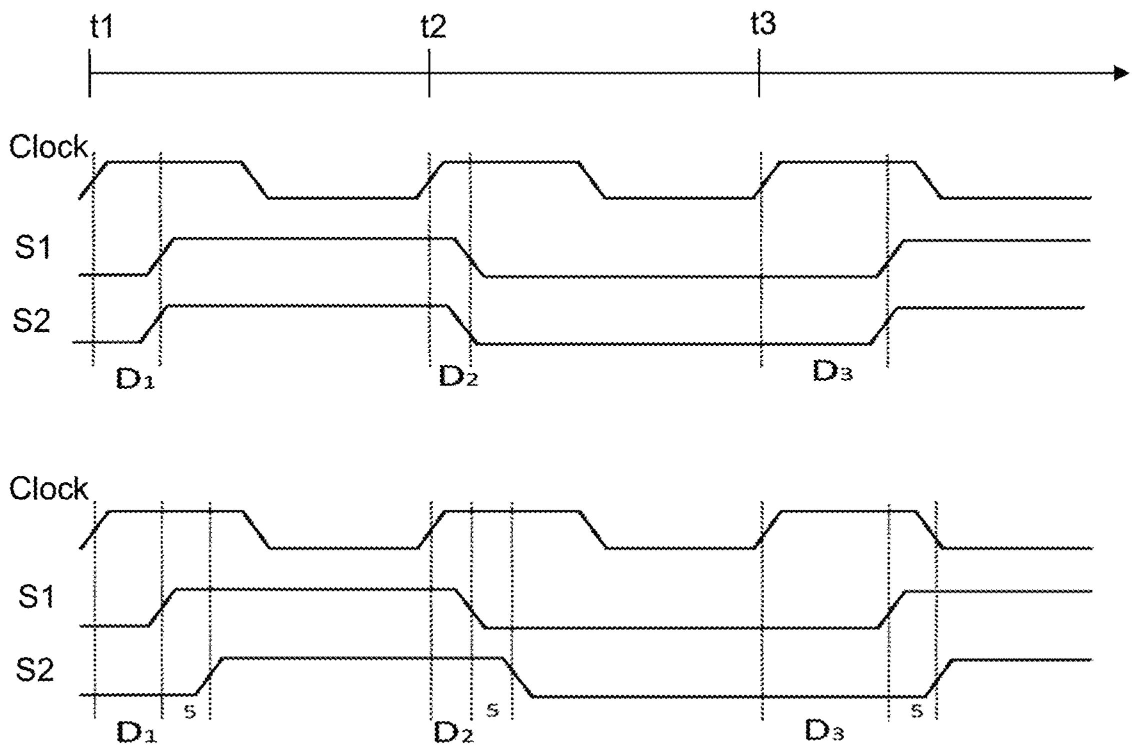
FIG. 9 shows a timing diagram of two signal delays for IC margin measurement and failure prediction.

Reference is now made to FIG. 9 (upper diagram), which shows a timing diagram of two signal delays for IC failure prediction. The multiple signals are switched simultaneously, with equal delay and logic value at each cycle. The duplicate signals are implemented with the smallest margin. The maximum value of [Xi+di] is shown, where delay of the duplicated paths was increased by 15 time-units. Both paths implement the same degradation.

Figure 10:
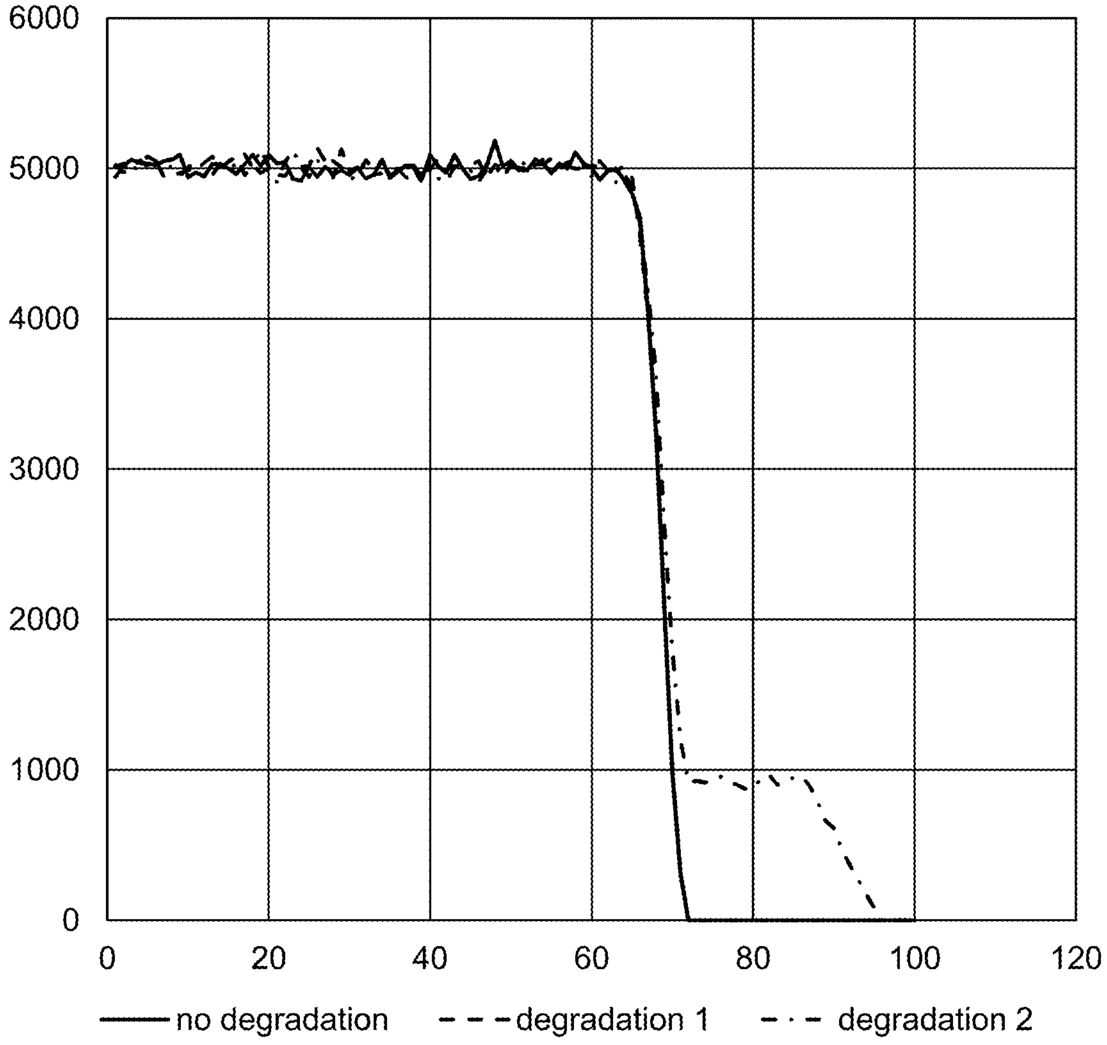
FIG. 10 shows a graph of errors versus cycle time for a third experiment.

Reference is now made to FIG. 10, which shows a graph of errors versus cycle time for a third experiment. The solid line represents no degradation, the dashed line (similar to the solid line) represents a first degradation scenario (FIG. 9 upper line), and the dot-dashed line represents a second degradation scenario in which the delay of one of the duplicated paths was increased by an additional 5 time-units (FIG. 9 lower line). Note that the delays of the replica signal are smaller by 5 time-units with respect to the base signal. The two paths are logically identical, but implement different timing degradations. The minimum margin was equal to 25 time-units, such as [100-75]. In a first degradation scenario (dashed line), the system may not detect the change in the margin. MaxD2 at failure equals 75 time-units for both scenarios. In a second degradation scenario (dot-dashed line), the system detects the change in the margin. MaxD2 at failure was 95 time-units.

A range of circuit designs and schematics are described herein. It will be appreciated that these circuit designs can be embodied in an electronic (also 'digital') representation (also 'encoding'). The electronic representation may be stored in a computer readable medium, particularly of a non-transitory nature. A suitable electronic representation may include a representation for Electronic Computer-Aided Design (ECAD) software, also referred to as Electronic Design Automation (EDA) software. In this case, parts of the representation may be stored across multiple electronic documents or files, possibly including one or more libraries of the ECAD software providing details of the components of the circuit. The ECAD representation may provide instructions suitable for manufacture (also 'fabrication') of a circuit as represented in the design. The instructions (in the form of a ECAD representation or other encoding) may then be provided to and used by IC fabrication equipment to fabricate a circuit in line with the instructions. According to the disclosure, there may be provided such an electronic representation. A method of using such an electronic representation of an electronic circuit as part of manufacturing the electronic circuit is further considered.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document referred to in this application, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, computer readable encodings and representations of same, whether embodied in media or combined with suitable reader facilities to allow fabrication, test, or design refinement of the corresponding circuits and/or structures are also disclosed. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein. The scope of the invention is defined by the appended claims.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A sensor for measuring a specific logic circuitry of a semiconductor Integrated Circuit (IC), comprising:

a signal splitter, configured to split a signal from the specific logic circuitry into two test paths;

a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value;

a comparison circuit configured to compare the delayed first test path and a second of the two test paths and provide a measurement output according to the comparison for an instance of measuring; and a controller, configured to set the predetermined timing margin such that, over a plurality of the instances of measuring, a frequency of selection of the shortest timing margin value is higher than a frequency of selection of each of the at least one longer timing margin value, wherein each of the instances of the measuring determines if a failure condition is met for the respective predetermined timing margin, and wherein the controller is further configured to output an indication of a maximum timing margin for which the failure condition is not met and/or a minimum timing margin for which the failure condition is met, based on the determinations for the plurality of instances of the measuring.

2. The sensor of claim 1, wherein the controller is configured to select the respective predetermined timing margin for each measuring over successive instances of the plurality of instances from the group of discrete timing margin values according to a predetermined sequence, the predetermined sequence being defined such that the frequency of selection of the shortest timing margin value is higher than the frequency of selection of each of the at least one longer timing margin value.

3. The sensor of claim 2, wherein the predetermined sequence repeats each predefined number of instances.

4. The sensor of claim 1, wherein the sensor is local to the specific logic circuitry.

5. The sensor of claim 1, wherein the comparison circuit comprises a logic gate configured to receive a signal from the delayed first test path and a signal from the second test path as inputs.

6. The sensor of claim 1, wherein the group of discrete timing margin values comprises a shortest timing margin value and a plurality of longer timing margin values.

7. The sensor of claim 6, wherein the frequency of selection of the shortest timing margin value is at least a sum of frequencies of selection of each of the plurality of longer timing margin values.

8. The sensor of claim 6, wherein for each of the plurality of longer timing margin values, a frequency of selection of the respective timing margin value is higher than a frequency of selection of each timing margin value longer than the respective timing margin value.

9. The sensor of claim 6, wherein for each of the plurality of longer timing margin values, the ratio of the frequency of selection of the shortest timing margin value to the frequency of selection of the respective longer timing margin value is inversely proportional to the ratio of the shortest timing margin value to the respective longer timing margin value.

10. The sensor of claim 6, wherein the plurality of longer timing margin values are defined as a sequence, each longer timing margin value in the sequence being double a preceding longer timing margin value in the sequence.

11. The sensor of claim 1, wherein the measuring is performed on a combined data path signal comprising a combination of individual data path signals, each of the individual data path signals coming from a different part of the specific logic circuitry.

12. The sensor of claim 1, further comprising:

a signal path combiner, configured to combine signals from multiple data paths of the specific logic circuitry; and wherein the signal from the specific logic circuitry provided to the signal splitter comprises the combined signals.

13. The sensor of claim 1, wherein the controller is configured to set the predetermined timing margin so as to apply varying delay to the signal passing through the first test path over different instances of the measurement and to determine a worst-case remaining margin of the multiple data paths, based on the comparison of the first and second test paths.

14. A system for measuring a semiconductor integrated circuit (IC), the system comprising:
- a functional circuit of the semiconductor IC, comprising logic circuitry; and
- a sensor on the semiconductor IC, associated with the functional circuit and configured to receive a signal from one or more data paths of the logic circuitry, the sensor comprising:
  - a signal splitter, configured to split a signal from the specific logic circuitry into two test paths;
  - a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value; and
  - a comparison circuit configured to compare the delayed first test path and a second of the two test paths and provide a measurement output according to the comparison for an instance of measuring,
- wherein the system is configured to set the predetermined timing margin such that, over a plurality of instances of the measurement, a frequency of selection of the shortest timing margin value is higher than a frequency of selection of each of the at least one longer timing margin value, wherein each of the instances of the measurement determines if a failure condition is met for the respective predetermined timing margin, and
  - wherein the system is further configured to output an indication of a maximum timing margin for which the failure condition is not met and/or a minimum timing margin for which the failure condition is met, based on the determinations for the plurality of instances of the measuring.

15. The system of claim 14, wherein the system is configured to set the predetermined timing margin using a controller on the semiconductor IC and/or an interface external the semiconductor IC.

16. The system of claim 14, wherein the system is further configured to determine a timing margin of the functional circuit based on the plurality of instances of the measurement and to set a clock of the semiconductor IC based on the determined timing margin.

17. The system of claim 16, wherein the system is configured to set the clock of the semiconductor IC and/or the voltage of the semiconductor IC using one or more of: an Automatic Voltage Scaling (AVS) mechanism; an Automatic Frequency Scaling mechanism (AFS) and a Dynamic Voltage and Frequency Scaling (DVFS) mechanism.

18. A non-transitory computer readable medium having stored thereon a computer-readable encoding of a sensor for measurement in a semiconductor Integrated Circuit (IC), the computer-readable encoding of the sensor comprising encodings of:
- a signal splitter, configured to split a signal from the specific logic circuitry into two test paths;
- a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value;
- a comparison circuit configured to compare the delayed first test path and a second of the two test paths and provide a measurement output according to the comparison for an instance of measuring; and
- a controller, configured to set the predetermined timing margin such that, over a plurality of instances of the measurement, a frequency of selection of the shortest timing margin value is higher than a frequency of selection of each of the at least one longer timing margin value, wherein each of the instances of the measuring determines if a failure condition is met for the respective predetermined timing margin, and
  - wherein the controller is further configured to output an indication of a maximum timing margin for which the failure condition is not met and/or a minimum timing margin for which the failure condition is met, based on the determinations for the plurality of instances of the measuring.

19. A sensor for measuring a specific logic circuitry of a semiconductor Integrated Circuit (IC), comprising:
- a signal splitter, configured to split a signal from the specific logic circuitry into two test paths;
- a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value;
- a comparison circuit configured to compare the delayed first test path and a second of the two test paths and provide a measurement output according to the comparison for an instance of measuring; and
- a controller, configured to set the predetermined timing margin such that, over a plurality of the instances of measuring, a frequency of selection of the shortest timing margin value is higher than a frequency of selection of each of the at least one longer timing margin value,
  - wherein the controller is further configured to set the predetermined timing margin so as to apply varying delay to the signal passing through the first test path over different instances of the measurement and to determine a worst-case remaining margin of the multiple data paths, based on the comparison of the first and second test paths.

20. The sensor of claim 19, wherein the controller is configured to select the respective predetermined timing margin for each measuring over successive instances of the plurality of instances from the group of discrete timing margin values according to a predetermined sequence, the predetermined sequence being defined such that the frequency of selection of the shortest timing margin value is higher than the frequency of selection of each of the at least one longer timing margin value.

21. The sensor of claim 20, wherein the predetermined sequence repeats each predefined number of instances.

22. The sensor of claim 19, wherein the sensor is local to the specific logic circuitry.

23. The sensor of claim 19, wherein the comparison circuit comprises a logic gate configured to receive a signal from the delayed first test path and a signal from the second test path as inputs.

24. The sensor of claim 19, wherein the group of discrete timing margin values comprises a shortest timing margin value and a plurality of longer timing margin values.

25. The sensor of claim 24, wherein the frequency of selection of the shortest timing margin value is at least a sum of frequencies of selection of each of the plurality of longer timing margin values.

26. The sensor of claim 24, wherein for each of the plurality of longer timing margin values, a frequency of selection of the respective timing margin value is higher than a frequency of selection of each timing margin value longer than the respective timing margin value.

27. The sensor of claim 24, wherein for each of the plurality of longer timing margin values, the ratio of the frequency of selection of the shortest timing margin value to the frequency of selection of the respective longer timing margin value is inversely proportional to the ratio of the shortest timing margin value to the respective longer timing margin value.

28. The sensor of claim 24, wherein the plurality of longer timing margin values are defined as a sequence, each longer timing margin value in the sequence being double a preceding longer timing margin value in the sequence.

29. The sensor of claim 19, wherein the measuring is performed on a combined data path signal comprising a combination of individual data path signals, each of the individual data path signals coming from a different part of the specific logic circuitry.

30. The sensor of claim 19, further comprising:
- a signal path combiner, configured to combine signals from multiple data paths of the specific logic circuitry; and
- wherein the signal from the specific logic circuitry provided to the signal splitter comprises the combined signals.

31. A system for measuring a semiconductor integrated circuit (IC), the system comprising:
- a functional circuit of the semiconductor IC, comprising logic circuitry; and
- a sensor on the semiconductor IC, associated with the functional circuit and configured to receive a signal from one or more data paths of the logic circuitry, the sensor comprising:
  - a signal splitter, configured to split a signal from the specific logic circuitry into two test paths;
  - a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value; and
  - a comparison circuit configured to compare the delayed first test path and a second of the two test paths and provide a measurement output according to the comparison for an instance of measuring,
- wherein the system is configured to set the predetermined timing margin such that, over a plurality of instances of the measurement, a frequency of selection of the shortest timing margin value is higher than a frequency of selection of each of the at least one longer timing margin value,
  - wherein the system is further configured to set the predetermined timing margin so as to apply varying delay to the signal passing through the first test path over different instances of the measurement and to determine a worst-case remaining margin of the multiple data paths, based on the comparison of the first and second test paths.

32. A non-transitory computer readable medium having stored thereon a computer-readable encoding of a sensor for measurement in a semiconductor Integrated Circuit (IC), the computer-readable encoding of the sensor comprising encodings of:
- a signal splitter, configured to split a signal from the specific logic circuitry into two test paths;
- a delay element, configured to receive and apply a delay to a first of the two test paths, the delay being based on a predetermined timing margin that is selected from a group of discrete timing margin values, the group of discrete timing margin values comprising a shortest timing margin value and at least one longer timing margin value;
- a comparison circuit configured to compare the delayed first test path and a second of the two test paths and provide a measurement output according to the comparison for an instance of measuring; and
- a controller, configured to set the predetermined timing margin such that, over a plurality of instances of the measurement, a frequency of selection of the shortest timing margin value is higher than a frequency of selection of each of the at least one longer timing margin value,
  - wherein the controller is further configured to set the predetermined timing margin so as to apply varying delay to the signal passing through the first test path over different instances of the measurement and to determine a worst-case remaining margin of the multiple data paths, based on the comparison of the first and second test paths.

* * * * *